United States Patent
Shibazaki

(10) Patent No.: US 10,048,598 B2
(45) Date of Patent: Aug. 14, 2018

(54) MOVABLE BODY APPARATUS, EXPOSURE APPARATUS, AND DEVICE MANUFACTURING METHOD

(71) Applicant: NIKON CORPORATION, Tokyo (JP)

(72) Inventor: Yuichi Shibazaki, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 37 days.

(21) Appl. No.: 14/901,543

(22) PCT Filed: Jun. 26, 2014

(86) PCT No.: PCT/JP2014/066919
§ 371 (c)(1),
(2) Date: Feb. 26, 2016

(87) PCT Pub. No.: WO2014/208634
PCT Pub. Date: Dec. 31, 2014

(65) Prior Publication Data
US 2016/0170312 A1    Jun. 16, 2016

(30) Foreign Application Priority Data
Jun. 28, 2013 (JP) .................. 2013-135714

(51) Int. Cl.
*F16M 11/00* (2006.01)
*G03B 27/58* (2006.01)
(Continued)

(52) U.S. Cl.
CPC .......... *G03F 7/70716* (2013.01); *G03F 7/709* (2013.01); *G03F 7/70758* (2013.01); *G03F 7/70991* (2013.01); *H01L 21/68* (2013.01)

(58) Field of Classification Search
CPC .. G03F 7/70716; G03F 7/70758; G03F 7/709; G03F 7/70991; H01L 21/68
(Continued)

(56) References Cited

U.S. PATENT DOCUMENTS 4,780,617 A   10/1988 Umatate et al.
5,448,332 A   9/1995 Sakakibara et al.
(Continued)

FOREIGN PATENT DOCUMENTS

JP   S62-266490 A   11/1987
JP   H06-069096 A   3/1994
(Continued)

OTHER PUBLICATIONS

Jun. 19, 2017 Search Report issued in European Patent Application No. 14816681.
(Continued)

*Primary Examiner* — Colin Kreutzer
(74) *Attorney, Agent, or Firm* — Oliff PLC

(57) ABSTRACT

A supporting member on which a wafer table is mounted is substantially kinematically supported, via six rod members placed on a slider. Further, coupling members are placed facing in a non-contact manner via a predetermined gap, thin plate-shaped edges provided at both ends in the Y-axis direction of the supporting member. By this arrangement, vibration-damping is performed by the coupling members (squeeze dampers) facing the edges, on vibration of the supporting member mounted on the wafer table. Further, because the supporting member is kinematically supported via the plurality of rod members, it becomes possible to reduce deformation of the wafer table that accompanies deformation of the slider.

20 Claims, 10 Drawing Sheets

(51) Int. Cl.
  *G03B 27/62* (2006.01)
  *H02K 11/02* (2016.01)
  *G03F 7/20* (2006.01)
  *H01L 21/68* (2006.01)

(58) Field of Classification Search
  USPC .................. 248/636, 638; 310/12.05, 12.06; 318/649; 355/72, 75
  See application file for complete search history.

(56) References Cited

U.S. PATENT DOCUMENTS

| | | | |
|---|---|---|---|
| 5,545,962 | A | 8/1996 | Wakui |
| 5,646,413 | A | 7/1997 | Nishi |
| 6,452,292 | B1 | 9/2002 | Binnard |
| 6,611,316 | B2 | 8/2003 | Sewell |
| 6,778,257 | B2 | 8/2004 | Bleeker et al. |
| 6,940,582 | B1 | 9/2005 | Tanaka |
| 7,023,610 | B2 | 4/2006 | Ohtsuki et al. |
| 7,561,280 | B2 | 7/2009 | Schluchter et al. |
| 2003/0025890 | A1 | 2/2003 | Nishinaga |
| 2003/0098963 | A1* | 5/2003 | Phillips .................. G03B 27/60 355/73 |
| 2003/0098964 | A1 | 5/2003 | Lee et al. |
| 2006/0017908 | A1 | 1/2006 | Mayama |
| 2007/0292245 | A1 | 12/2007 | Phillips et al. |
| 2008/0068568 | A1 | 3/2008 | Ebihara et al. |
| 2008/0106722 | A1 | 5/2008 | Shibazaki |
| 2008/0259469 | A1 | 10/2008 | Arai |
| 2009/0015817 | A1* | 1/2009 | Morimoto .............. G03B 27/62 355/75 |
| 2009/0233234 | A1 | 9/2009 | Shibazaki |
| 2009/0284723 | A1 | 11/2009 | Shibazaki |
| 2010/0073653 | A1 | 3/2010 | Shibazaki |
| 2010/0296071 | A1 | 11/2010 | Shibazaki |
| 2010/0297562 | A1 | 11/2010 | Shibazaki |
| 2011/0008734 | A1 | 1/2011 | Ichinose |
| 2011/0053061 | A1 | 3/2011 | Shibazaki |

FOREIGN PATENT DOCUMENTS

| | | |
|---|---|---|
| JP | H06-099332 A | 4/1994 |
| JP | H07-094402 A | 4/1995 |
| JP | 2001-325005 A | 11/2001 |
| JP | 2003-324053 A | 11/2003 |
| JP | 2004-260117 A | 9/2004 |
| JP | 2005-191150 A | 7/2005 |
| JP | 2005-203483 A | 7/2005 |
| JP | 2006-032788 A | 2/2006 |
| JP | 2006-078187 A | 3/2006 |
| JP | 2008-515219 A | 5/2008 |
| JP | 2010-080863 A | 4/2010 |
| JP | 2012-133255 A | 7/2012 |
| JP | 2012-531028 A | 12/2012 |
| JP | 2013-098355 A | 5/2013 |
| WO | 01/035168 A1 | 5/2001 |
| WO | 2008/133234 A1 | 11/2008 |
| WO | 2009/133702 A1 | 11/2009 |
| WO | 2011/040642 A2 | 4/2011 |

OTHER PUBLICATIONS

Sep. 30, 2014 Search Report issued in International Patent Application No. PCT/JP2014/066919.
Sep. 30, 2014 Written Opinion issued in International Patent Application No. PCT/JP2014/066919.
Translation of JP 2005-203483 A which was previously submitted in the U.S. Patent and Trademark Office on Feb. 26, 2016.
Translation of JP S62-266490 A which was previously submitted in the U.S. Patent and Trademark Office on Feb. 26, 2016.
Sep. 19, 2017 Office Action issued in Japanese Patent Application No. 2015-524101.
Feb. 13, 2018 Office Action issued in Japanese Patent Application No. 2015-524101.

* cited by examiner

MOVABLE BODY APPARATUS, EXPOSURE APPARATUS, AND DEVICE MANUFACTURING METHOD

TECHNICAL FIELD

The present invention relates to movable body apparatuses, exposure apparatuses, and device manufacturing methods, and more particularly to a movable body apparatus equipped with a movable body which holds an object and is movable in directions of six degrees of freedom, an exposure apparatus with the movable body apparatus, and a device manufacturing method that uses the exposure apparatus.

BACKGROUND ART

Conventionally, in a lithography process for manufacturing an electronic device (micro device) such as a semiconductor device (an integrated circuit or the like) or a liquid crystal display device, a projection exposure apparatus of a step-and-repeat method (a so-called stepper), a projection exposure apparatus of a step-and-scan method (so-called scanning stepper (also called a scanner)) or the like is mainly used.

In this type of exposure apparatus, as the stage (wafer stage) which moves two-dimensionally holding a substrate such as a wafer or a glass plate that serves as an exposure subject, a coarse/fine movement separate type stage is mainstream (for example, refer to PTL 1), which is a combination of; a coarse movement stage that generates a large force but has low controllability, and a fine movement stage whose controllability is high, is mounted on the coarse movement stage, generates only a small force and is finely driven with respect to the coarse movement stage.

However, while it is relatively easy to acquire positioning accuracy with the coarse/fine movement separate type stage, because a chuck member such as a vacuum chuck or an electrostatic chuck for performing vacuum chucking or electrostatic suction of the wafer is provided at the fine movement stage, it is necessary to connect cables or piping for supplying power such as electric power or vacuum to the fine movement stage. In addition, as a coarse movement driver for driving the coarse movement stage, for example, even if a moving-magnet-type linear motor which does not require any wiring is used at the stage side because a driver for fine movement is installed in the coarse movement stage to drive the fine movement stage, it is necessary to connect a power supply cable for supplying electric power or the like to the fine movement driver to the coarse movement stage. In this manner, the coarse/fine movement separate type stage had demerits in which the device became complicated, the weight of the device increasing, and the cost of the device increasing.

As a method for solving these drawbacks of the coarse/fine movement stage, employing one stage is for the wafer stage is considered and development is being performed for practical use, instead of employing the two stages which are the coarse movement stage and the fine movement stage.

SUMMARY OF INVENTION

Solution to Problem

The inventor is earnestly continuing studies to practical usage of a coarse/fine movement integral-type wafer stage, however, adding to vibration at the time of stage drive, for example, when a stage is driven by, e.g., a planar motor, it has recently become clear of a risk that positioning accuracy of a wafer table holding a wafer may decrease due to thermal deformation or the like of a slider member (stage main section) provided at the mover of the planar motor.

The present invention has been made under the circumstances described above, and according to a first aspect of the present invention, there is provided a movable body apparatus that can move an object held by a holding member, comprising: a base member; a supporting member connected to the base member that supports the holding member; and a vibration-damping section placed between the base member and the holding member that suppresses vibration of the supporting member.

According to this apparatus, vibration-damping of the vibration of the supporting member holding the e holding member supporting the object is performed, by the vibration-damping section provided in between the base member and the holding member. Further, because the holding member is supported by the supporting member connected to the base member, deformation of the holding member that accompanies deformation of the base member can be reduced.

According to a second aspect of the present invention, there is provided an exposure apparatus that exposes an object with an energy beam, comprising: the movable body apparatus according to the first aspect; and a pattern generating device that generates a pattern on the object by irradiating the energy beam on the object.

According to a third aspect of the present invention, there is provided a device manufacturing method, including: exposing an object using the exposure apparatus of the second aspect; and developing the object that has been exposed.

BRIEF DESCRIPTION OF DRAWINGS

FIG. 3 is a view showing an arrangement of parts such as an interferometer system and an alignment detection system that the exposure apparatus in FIG. 1 is equipped with.

DESCRIPTION OF EMBODIMENTS

Hereinafter, an embodiment will be described, based on FIGS. 1 to 10.

Figure 1:
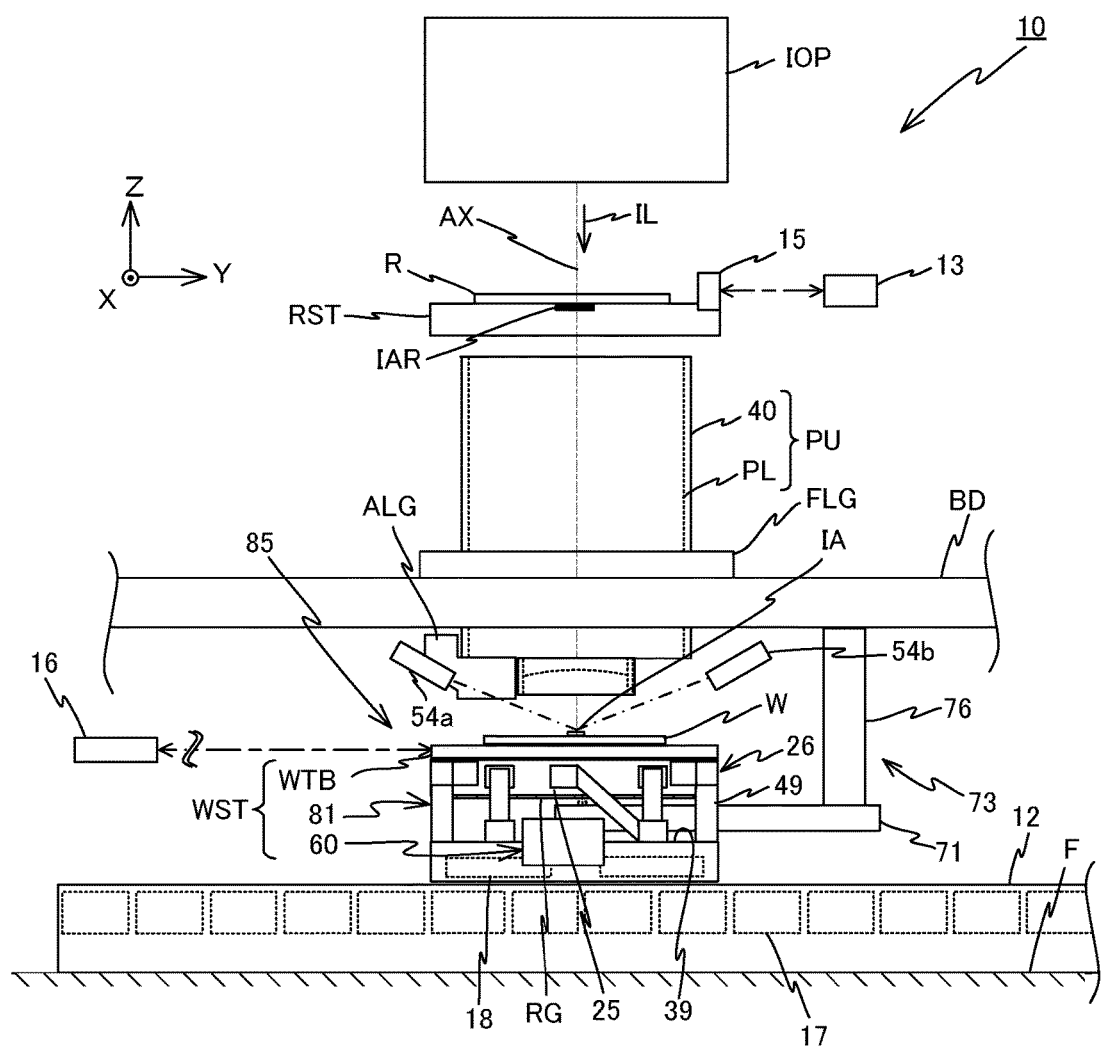
FIG. 1 is a view schematically showing a structure of exposure apparatus according to an embodiment.

FIG. 1 schematically shows a structure of an exposure apparatus 10 in accordance with an embodiment. Exposure apparatus 10 is a projection exposure apparatus of a step-and-scan method, or a so-called scanner. As it will be described later on, in the present embodiment, a projection optical system PL is provided, and in the description below, a direction parallel with an optical axis AX of this projection optical system PL will be described as a Z-axis direction, a direction in which a reticle and a wafer are relatively scanned within a plane orthogonal to the Z-axis direction will be described as a Y-axis direction, a direction orthogonal to the Z-axis and to the Y-axis will be described as an X-axis direction, and rotation (tilt) directions around the X-axis, the Y-axis, and the Z-axis will each be described as a θx direction, a θy direction, and a θz direction.

Exposure apparatus 10, as is shown in FIG. 1, is equipped with an illumination system IOP, a reticle stage RST, a projection unit PU, a wafer stage WST which moves two-dimensionally within an XY plane independently on base board 12, and a control system and a measurement system for these parts.

Illumination system IOP, as is disclosed in, for example, U.S. Patent Application Publication No. 2003/0025890, includes a light source, an illuminance equalizing optical system including an optical integrator and the like, and an illumination optical system which has a reticle blind and the like (none of which are shown). Illumination system IOP illuminates a slit-shaped illumination area IAR on a reticle R set (restricted) by the reticle blind (also called a masking system), with an illumination light (exposure light) IL at an almost uniform illuminance. Here, as illumination light IL, as an example, an ArF excimer laser beam (wavelength 193 nm) is used.

On reticle stage RST, reticle R that has a circuit pattern or the like formed on its pattern surface (the lower surface in FIG. 1) is fixed, for example, by vacuum chucking. Reticle stage RST is finely drivable within the XY plane by a reticle stage driving system 11 (not shown in FIG. 1, refer to FIG. 10) including, for example, a linear motor and the like, and is also drivable at a predetermined scanning speed in a scanning direction (the Y-axis direction, which is the lateral direction of the page surface in FIG. 1).

Position information within the XY plane of reticle stage RST (including rotation information in the θz direction) is constantly detected, for example, at a resolution of around 0.25 nm, by a reticle laser interferometer (hereinafter called a "reticle interferometer") 13, via a movable mirror 15 (a Y movable mirror (or a retroreflector) having a reflection surface orthogonal to the Y-axis direction and an X movable mirror having a reflection surface orthogonal to the X-axis direction are actually provided) fixed to reticle stage RST. Measurement values of reticle interferometer 13 are sent to a main controller 20 (not shown in FIG. 1, refer to FIG. 10). Instead of the interferometer, an encoder system can be used to obtain the position information.

Projection unit PU is placed below reticle stage RST in FIG. 1. Projection unit PU is supported by a main frame BD placed horizontally above base board 12, via a flange section FLG provided at the outer circumference section of the main frame. Main frame BD is supported by a plurality of supporting members which are not shown, made up of plate members supported by a floor F, via vibration-damping devices.

Projection unit PU includes a barrel 40, and projection optical system PL held within barrel 40. As projection optical system PL, for example, a dioptric system is used, consisting of a plurality of optical elements (len elements) arranged along optical axis AX parallel to the Z-axis. Projection optical system PL, for example, is double telecentric, and has a predetermined projection magnification (for example, ¼ times, ⅕ times or ⅛ times). Therefore, when illumination area IAR on reticle R is illuminated by illumination light IL from illumination system IOP, by illumination light IL having passed through reticle R, which is placed with its pattern surface almost coinciding with a first plane (object plane) of projection optical system PL, a reduced image of the circuit pattern of reticle R (a reduced image of a part of the circuit pattern) within illumination area IAR is formed in an area (hereinafter, also called an exposure area) IA conjugate to illumination area IAR on wafer W whose surface is coated with a resist (sensitive agent) and is placed on a second plane (image plane) side of projection optical system PL, via projection optical system PL (projection unit PU). And, with reticle R being relatively moved in the scanning direction (Y-axis direction) with respect to illumination area IAR (illumination light IL) and wafer W being relatively moved in the scanning direction (Y-axis direction) with respect to exposure area IA (illumination light IL) by the synchronous drive of reticle stage RST and wafer stage WST, scanning exposure of a shot area (divided area) on wafer W is performed, and the pattern of reticle R is transferred onto the shot area. That is, in the present embodiment, the pattern of reticle R is generated on wafer W by illumination system IOP and projection optical system PL, and by illumination light IL exposing the sensitive layer (resist layer) on wafer W, the pattern is formed on wafer W.

Wafer stage WST, as is shown in FIG. 1, is supported by levitation above base board 12 via a predetermined gap (gap, clearance). Wafer stage WST, as is shown in FIG. 1, is equipped with a stage main section 81, and a wafer table WTB fixed to the upper surface of stage main section 81. At a surface on a +X side (the front side of the page surface in FIG. 1) of stage main section 81, a second stage device 60, which will be described later on, is provided. Incidentally, in FIG. 1, wafer W is held on wafer table WTB.

Base board 12 is supported almost horizontally (parallel to the XY plane) on floor F, by a plurality of anti-vibration devices (omitted in drawings). Base board 12 is made up of a member that has a plate-like outer shape. Inside base board 12, as an armature unit of a planar motor (to be described later on), a coil unit is housed, including a plurality of coils 17 placed in a shape of a matrix with the XY two-dimensional direction serving as a row direction and a column direction.

Figure 4:
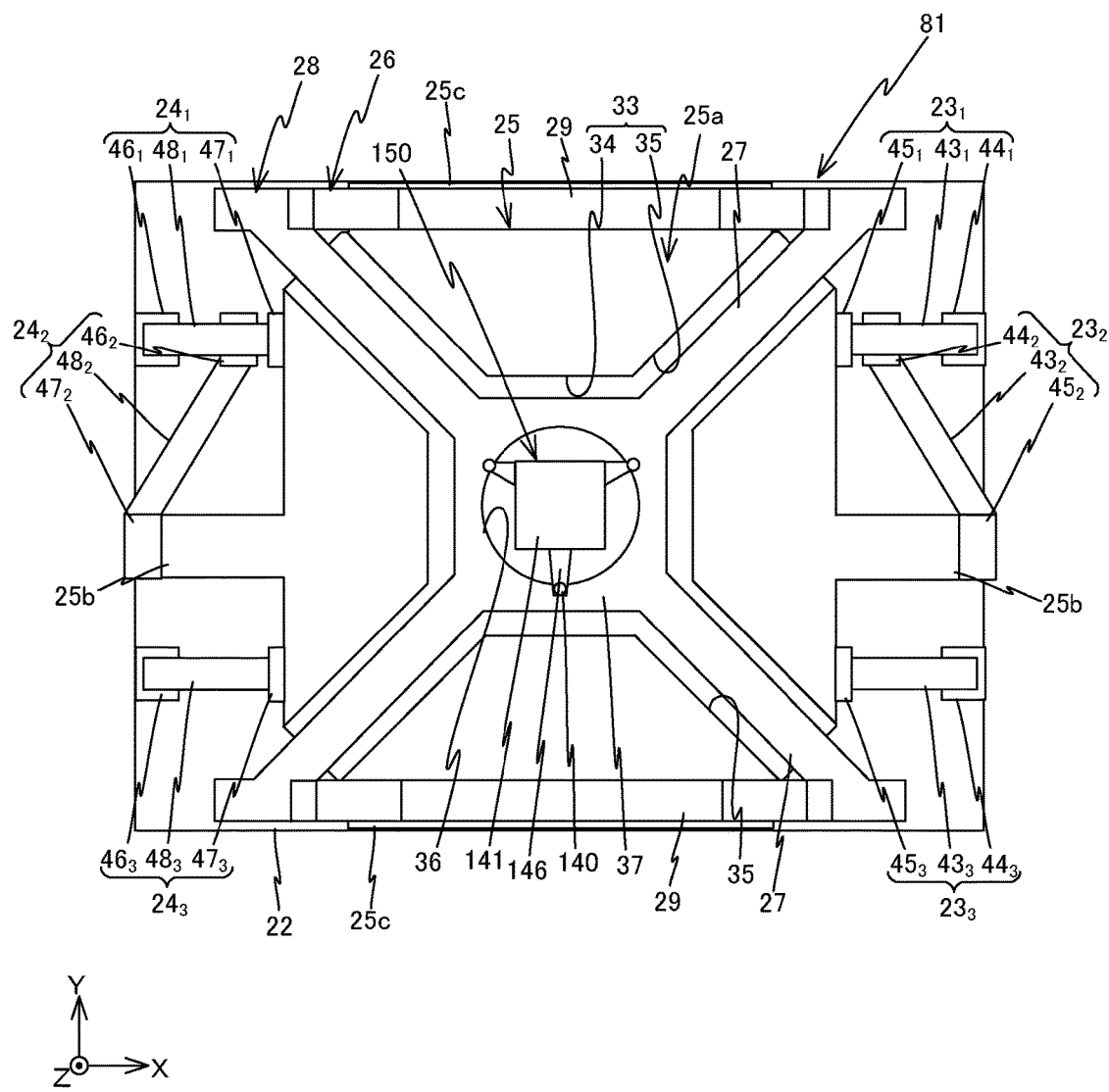
FIG. 4 is a planar view showing a stage main section, in which a wafer table is removed from a wafer stage in FIG. 2.
Figure 5A:
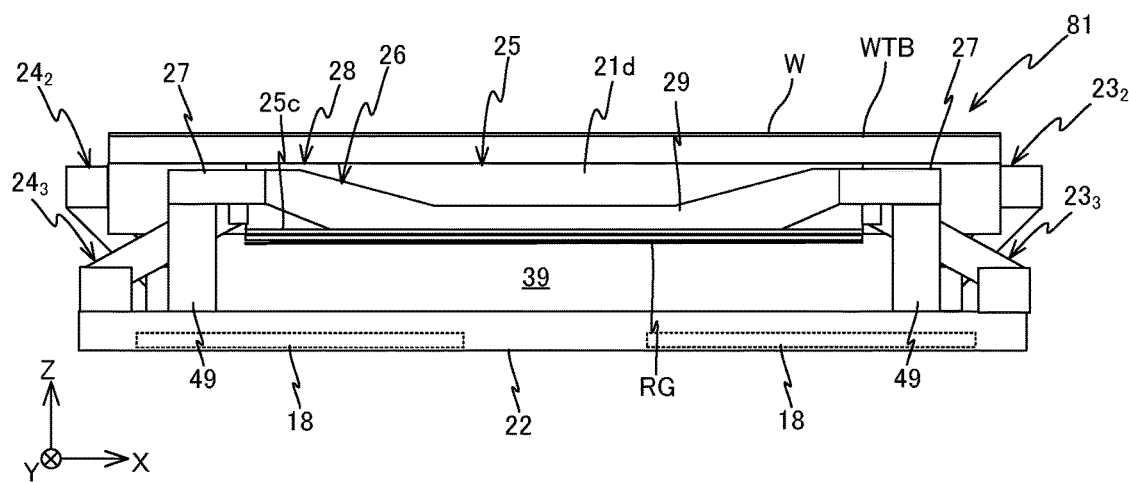
FIG. 5A is a front view of the wafer stage in FIG. 2.
Figure 5B:
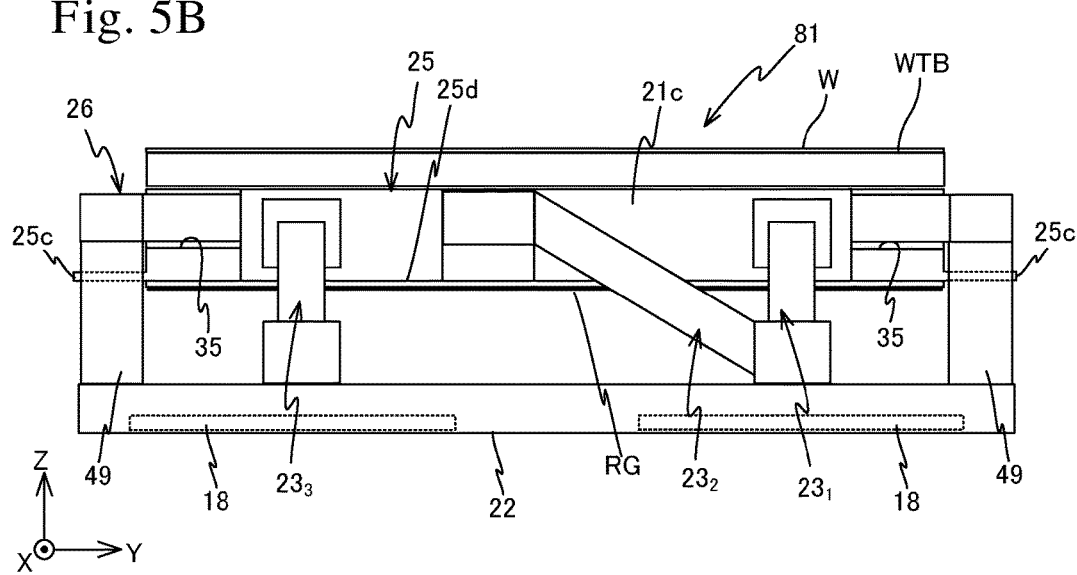
FIG. 5B is a side view of the wafer stage in FIG. 2.

Stage main section 81, as is shown in a planar view of FIG. 4, a front view (when viewed from the −Y direction) of FIG. 5A and a side view (when viewed from the +X direction) of FIG. 5B, is equipped with a slider 22, a box-shaped supporting member 25 which is supported on slider 22 via a plurality of, for example, six rod members $23_1$ to $23_3$ and $24_1$ to $24_3$, a frame 26 fixed on slider 22 via four support sections 49 and the like.

Slider 22 consists of a plate-shaped member of a rectangular shape in a planar view, which includes a magnet unit of the planar motor, with the length in the X-axis direction slightly longer than the length in the Y-axis direction. This magnet unit, as is shown in FIG. 5A, has a plurality of permanent magnets 18 placed at the bottom section of slider 22, in a state where its lower surface is positioned almost flush with the bottom surface of slider 22. The plurality of permanent magnets 18 are placed in a matrix shape with the XY two-dimensional direction serving as a row direction and a column direction, corresponding to the coil unit of base board 12. The magnet unit and the coil unit of base board 12 structure a wafer stage driving system 51A (refer to FIG. 10) disclosed in, for example, U.S. Pat. No. 6,452, 292 and the like, consisting of a planar motor which employs a driving method that uses a magnetic levitation moving magnet type electromagnetic force (Lorentz force). By wafer stage driving system 51A, wafer stage WST is driven in directions of six degrees of freedom (the X-axis direction, the Y-axis direction, the Z-axis direction, the θx direction, the θy direction, and the θz direction) with respect to base board 12.

The magnitude and direction of electric current supplied to each coil 17 structuring the coil unit are controlled by main controller 20. Hereinafter, wafer stage driving system 51A will also be referred to as a planar motor 51A.

Inside slider 22, a passage (not shown) is formed for a cooling medium (for example, cooling water or the like), and to the passage (not shown) passage, a coolant supply device 58 (refer to FIG. 10) is connected via a piping (not shown). Incidentally, the flow amount or the like of the cooling medium is controlled by main controller 20. Further, a space (not shown) can be formed inside slider 22, in which a weight that functions as a mass damper can be provided.

Figure 6:
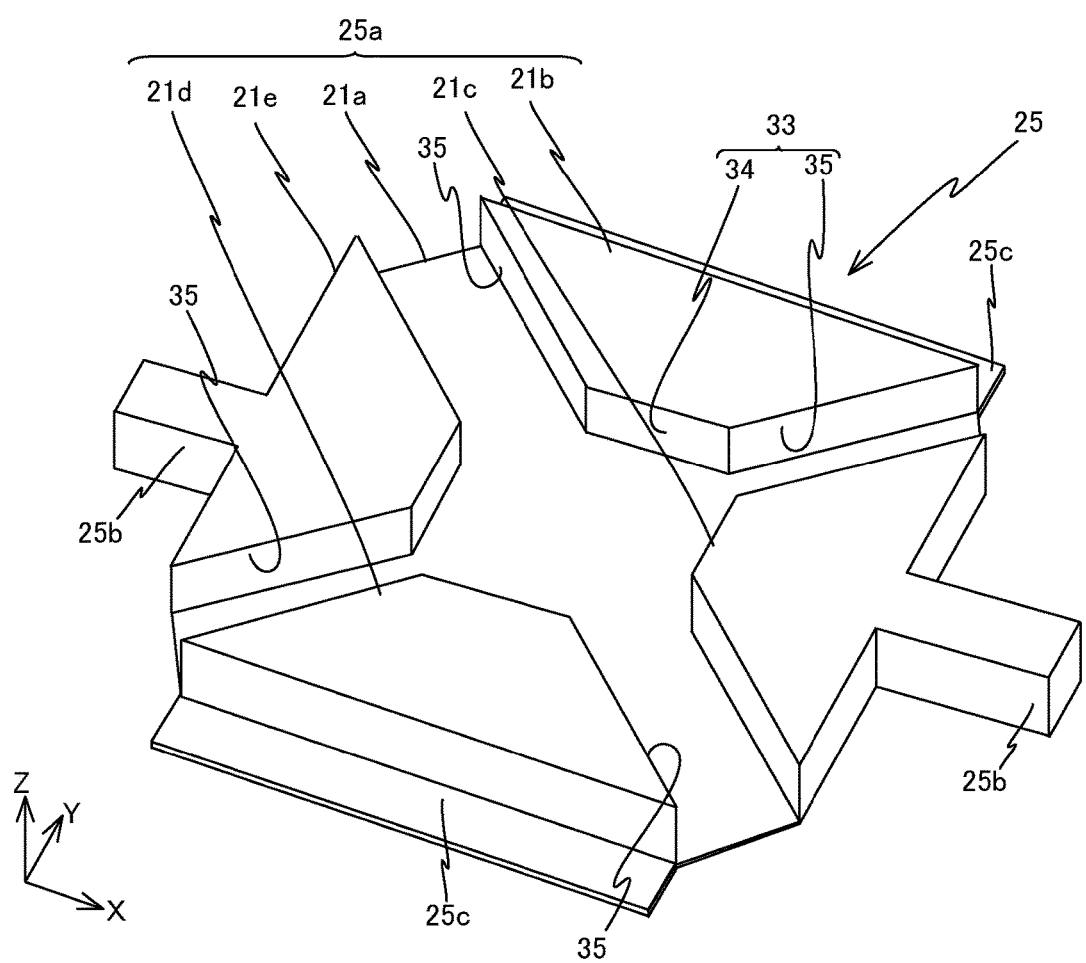
FIG. 6 is a perspective view showing a supporting member that is taken out.

Support member 25 is a member which supports wafer table WTB from below, that is, a member to which wafer table WTB is fixed on its upper surface. Support member 25 is fixed above slider 22, in a state where a predetermined spacing (gap) is formed with respect to slider 22 via the six rod members $23_1$ to $23_3$ and $24_1$ to $24_3$. FIG. 6 shows supporting member 25 separated, in a perspective view. Support member 25, as is shown in FIG. 6, has a supporting member main section 25a, a pair of protruding portions 25b each protruding outward in the X-axis direction, from positions slightly to the −Y side from the Y-axis direction center on both of the X-axis direction side surfaces of supporting member main section 25a, and a pair of edges 25c extending outside in the Y-axis direction from the lower end of both sides of the Y-axis direction side surfaces of supporting member main section 25a.

Support member main section 25a, as is shown in FIG. 4, is an octagonal shape in a planar view, like a square-shaped member in a planar view that has a length of one side shorter than the length of slider 22 in the Y-axis direction with the four corners cut off, that is, has an outline of an octagonal shape in a planar view that has a total of four long sides, which are two sides each parallel to the X-axis and the Y-axis, and a total of four short sides that form an angle of 45 degrees with respect to the X-axis and the Y-axis. Support member main section 25a, as is shown in FIG. 6, has a plate shaped section 21a having an octagonal shape in a planar view, and four trapezoidal sections 21b, 21c, 21d, and 21e provided on the upper surface of the plate-shaped section 21a at the four long side sections. By the four trapezoidal sections 21b, 21c, 21d, and 21e, on the upper surface of supporting member main section 25a, an X-shaped recess section (cross-shaped recess section) 33 of a predetermined depth for housing an X frame member 28 of frame 26 to be described later on is formed, as is shown in FIGS. 4 and 6. X-shaped recess section 33, as is shown in FIG. 6, includes a first recess section 34, which is octagonal in a planar view positioned in the center of the supporting member main section 25a upper surface, with a figure almost similar to supporting member main section 25a, and four second recess sections 35, which are arranged extending in directions forming an angle of 45 degrees with respect to the X-axis and the Y-axis, each from the four short sides of the first recess section 34 toward the four short sides of supporting member main section 25a.

The four trapezoidal sections 21b, 21c, 21d, and 21e of supporting member main section 25a have a predetermined thickness in a side surface view. Although it is omitted in the drawings, these four trapezoidal sections have their bottom surface sides thinned, along with a pair of protruding portions 25b that will be described next.

Each of the pair of protruding portion 25b is arranged protruding to the outer side in the X-axis direction on a surface on the +X side of trapezoidal section 21c and a surface on the −X side of trapezoidal section 21e. The pair of protruding portions 25b have almost the same thickness as the trapezoidal sections at which the protruding portions are provided.

As is shown in FIG. 4, supporting member 25 is supported on slider 22, via the six rod members $23_1$ to $23_3$ and $24_1$ to $24_3$ previously described, in a state where the tip surfaces of the pair of protruding portion 25b are positioned slightly to the inner surface side than both side surfaces in the X-axis direction of slider 22.

The pair of edges 25c, as is shown in FIG. 5B, consists of plate-shaped sections having a predetermined width that extends to the outer side in the Y-axis direction from both side surfaces in the Y-axis direction. The pair of edges 25c, in this case, respectively serves as both edges in the Y-axis direction of plate-shaped section 21a, and is structured by extending sections projecting to the +Y side and the −Y side from supporting member main section 25a. However, the structure is not limited to this, and the edges can be provided separately, and integrated with supporting member main section 25a. The pair of edges 25c is provided along the whole length of the long sides of trapezoidal sections 21b and 21c. Further, the upper surface of each of the edges 25c is made into a surface having a high degree of flatness parallel to the XY plane.

At the lower surface of supporting member 25, as is shown in FIG. 5B, a plate-shaped section 25d is provided, which covers almost all of supporting member main section 25a. At the lower surface of plate-shaped section 25d, a two-dimensional grating (hereinafter simply called grating) RG of an encoder system to be described later is provided. Grating RG includes a reflective diffraction grating (X diffractive grating) whose periodic direction is in the X-axis direction and a reflective diffraction grating (Y diffractive grating) whose periodic direction is in the Y-axis direction. The pitch of the grid lines of the X diffractive grating and the Y diffractive grating is set, for example, to 1 μm. Incidentally, while grating RG does not necessarily have to be arranged on the entire lower surface of plate-shaped section 25d described above, for example, the grating needs to cover the range in which wafer stage WST moves on exposure of wafer W, such as to include a rectangular-shaped area the size of around twice the diameter of wafer W.

The material of supporting member 25 is preferably a material having a low thermal expansion coefficient, such as, for example, Zerodur (brand name) of Schott Corporation is used. Further, the surface of grating RG can be protected covered by a protective member, such as, for example, a cover glass made of a transparent material through which light can pass, having a low thermal expansion coefficient around the same level as the material of supporting member 25.

Rod members $23_1$ to $23_3$, as is shown in FIG. 4, for example, are placed on the +X side of supporting member 25, and rod members $24_1$ to $24_3$ are placed on the −X side of supporting member 25. Incidentally, while rod members $23_1$ to $23_3$ and rod members $24_1$ to $24_3$ are placed symmetrical to a plane parallel to a YZ plane passing through the center of supporting member 25, the rod members consist of the same structure. Accordingly, the description hereinafter will be made, representatively taking up rod members $23_1$ to $23_3$.

Each rod member $23_i$ (i=1 to 3) has a rod-shaped member $43_i$, and joint members $44_i$ and $45_i$ consisting of rectangular parallelepiped members.

As it can be seen when viewing FIGS. 4 and 5B together, rod member $23_1$ and rod member 233 have an arrangement and structure symmetrical to a plane parallel to an XZ plane passing through the center of supporting member 25 in a planar view.

Rod member $23_1$ is placed near the +Y side edge at the edge surface on the +X side of supporting member 25. Joint member $44_1$ of rod member $23_1$, as is shown in FIGS. 4 and 5B, has its lower surface fixed to the upper surface of slider 22 at a position to the +X side edge near the +Y side edge. Further, joint member $45_1$ of rod member $23_1$ has a surface fixed to an edge surface at the +X side of supporting member 25 near the +Y side edge. Rod-shaped member $43_1$ of rod member $23_1$ has one end fixed to joint member $44_1$, and the other end fixed to joint member $45_1$. In this case, rod-shaped member $43_1$ is placed to be parallel to the Y-axis in a planar view, as well as a state tilted at a predetermined angle with respect to the Z-axis when viewed from the Y-axis direction (rod members $23_1$ is hiding behind rod member 233 in the depth of the page surface in FIG. 5A).

Rod member 233 is structured similar to rod member $23_1$ described above, however, being arranged symmetrical to the plane parallel to the XZ plane passing through the center of supporting member 25 in a planar view.

Joint member $44_2$ of rod member $23_2$, as is shown in FIG. 4, is placed on the −X side of joint member $44_1$ and its lower surface is fixed to the upper surface of slider 22. Joint member $45_2$ of rod member $23_2$ is fixed to the +X side surface of one of the protruding portions 25b (+X side). Rod-shaped member $43_2$ of rod member $23_2$ has one end fixed to joint member $44_2$, and the other end fixed to joint member $45_2$. In this case, rod-shaped member $43_2$ is placed tilted at a predetermined angle with respect to the Y-axis in a planar view, as well as placed being tilted at a predetermined angle with respect to the Z-axis in a front view as is shown in FIG. 5A and placed being tilted at a predetermined angle with respect to the Z-axis in a side surface view, as is shown further in FIG. 5B.

That is, rod members $23_1$ to $23_3$ are each placed, so that rod member $23_1$ and rod member $23_2$ partly overlap each other in a planar view as is shown in FIG. 4, rod members $23_1$, $23_3$ and rod member $23_2$ partly overlap one another in a front view as is shown in FIG. 5A, and rod member $23_1$ and rod member $23_2$ partly overlap each other in a side surface view as is shown in FIG. 5B.

Incidentally, as is described above, although rod members $24_1$ to $24_3$ are placed symmetrical to rod members $23_1$ to $23_3$ with respect to the plane parallel to the YZ plane passing through the center of supporting member 25, the rod members are structured in a similar manner. That is, rod member $24_i$ (i=1 to 3) has a rod-shaped member $48_i$, and joint members $46_i$ and $47_i$, consisting of rectangular parallelepiped members. And, rod-shaped member $48_i$ and each of the joint members $46_i$ and $47_i$ are placed symmetrical to rod-shaped member $43_i$ and each of the joint members $44_i$ and $45_i$ with respect to the plane parallel to the YZ plane passing through the center of supporting member 25.

In the present embodiment, by the six rod members $23_1$ to $23_3$ and $24_1$ to $24_3$ structured in the manner described above, supporting member 25 is restricted in a state where movement in directions of six degrees of freedom (the X, the Y, the Z, the θx, the θy, and the θz directions) is limited with respect to slider 22. That is, by the six rod members $23_1$ to $23_3$ and $24_1$ to $24_3$, supporting member 25 is supported (kinematic support) on slider 22 adequately (without excessive restraints, and without lack of restraint conditions).

Now, in the present embodiment, joint members $44_1$ to $44_3$, $45_1$ to $45_3$, $46_1$ to $46_3$, and $47_1$ to $47_3$, which are the fixed sections of rod members $23_1$ to $23_3$, and $24_1$ to $24_3$, are fixed by surface contact to each of the objects to be fixed (slider 22 and supporting member 25). Therefore, the restraint technically is not kinematic. However, a structure is employed in which rigidity with respect to compression and tension in the longitudinal direction of each of the rod-shaped members $43_1$ to $43_3$, and $44_1$ to $44_3$ is high, while rigidity becomes relatively low with respect to bending or the like in a direction orthogonal to the longitudinal direction. Therefore, it can be said that supporting member 25 is substantially kinematically supported with respect to slider 22, via six rod members $23_1$ to $23_3$, and $24_1$ to $24_3$.

Frame 26, as is shown in FIG. 4, has a rectangular-shaped section 37 positioned in the center of the supporting member main section 25a upper surface previously described, and X frame member 28 having an X-shape (cross-shape) in a planar view, consisting of four rod-shaped sections 27 extending radially in directions forming an angle of 45 degrees with respect to the X-axis and the Y-axis from the four corners of rectangular-shaped section. Frame 26, furthermore, has a pair of coupling members 29, which couples the edges of a pair of rod-shaped sections 27 positioned at the +Y side of rectangular-shaped section 37 of X frame member 28 and the edges of a pair of rod-shaped sections 27 positioned at the −Y side of rectangular-shaped section 37.

Rectangular-shaped section 37 has an octagonal shape (a rough rectangular shape) in a planar view, which is one size smaller than the first recess section 34 previously described, with a circular opening 36 formed in its center.

The width of the four rod-shaped sections 27 is set slightly smaller than the width of the four second recess sections 35 formed on the supporting member 25 upper surface.

Frame 26, as is shown in FIG. 5A, is mounted on slider 22, in a state where a predetermined gap is arranged with respect to the upper surface of slider 22, by the lower surface of the tip of rod-shaped section 27 of the four X frame members 28 being supported by each of the four support sections 49 extending in the Z-axis direction. The height of X frame member 28 (thickness in the Z-axis direction) is set slightly smaller than the depth of the first recess section 34 and the depth of the second recess sections 35. Further, X frame member 28 is housed in a non-contact manner inside X-shaped recess section 33 formed on the supporting member 25 upper surface, in a state where the upper surface of a remaining section (a section shown in FIG. 4, in which the X frame member 28 and supporting member 25 overlap each other in a planar view) which excludes a part of the tip of the four rod-shaped sections 27 is positioned slightly lower than the supporting member 25 upper surface. Therefore, when wafer table WTB is fixed to the supporting member 25 upper surface in the state where X frame member 28 of frame 26 is housed within X-shaped recess section 33 of supporting member 25 (in a state where stage main section 81 is assembled), the non-contact state is maintained between wafer table WTB and frame 26 (X frame member 28), as is shown in FIG. 5B.

As is obvious from the description so far, in the present embodiment, in between slider 22 and supporting member 25, and slider 22 and frame 26, a space 39 penetrating in the Y-axis direction is formed, as is shown in FIG. 5A.

Each of the pair of coupling members 29, as is shown in FIG. 4, consists of a rod-shaped member extending in the X-axis direction, and as FIG. 5A representatively shows coupling member 29 on the −Y side, has a shape like a bow which is slightly recessed in the center section when compared with both edges. The center lower surface of each of the pair of coupling members 29 is made into a surface with high flatness which is parallel to the XY plane.

The lower surface of each of the pair of coupling members 29 is placed so as to face in a non-contact manner the upper surface of the pair of edges 25c of the corresponding supporting member 25 via a slight gap (for example, 10 µm). The pair of coupling members 29 and the pair of edges 25c are positioned to face each other via a predetermined gap by being assembled with, for example, a shim (shim) in between on assembly.

Therefore, when supporting member 25 is vibrated by disturbance such as during the drive of wafer stage WST, a gap (a Z direction distance) between the pair of edges 25c which is a vibrating thin plate section and a fixed surface near the pair of edges 25c, namely the lower surface of the pair of coupling members 29, changes (increases or decreases). Accordingly, by the flow and compression of viscosity air between edges 25c and the lower surface of coupling member 29, a resistance force is generated with respect to edges 25c, and the vibration (high frequency vibration) of edges 25c is attenuated. That is, the vibration of supporting member 25 is attenuated by an air squeeze film damper effect. As is described, in the present embodiment, by the pair of coupling members 29, a squeeze film damper (hereinafter, also appropriately called a squeeze damper) is structured, which attenuates the vibration of supporting member 25 via edges 25c.

At frame 26, as is shown in FIG. 4, a wafer center supporting member (hereinafter shortened to center supporting member) 150 is provided. Center supporting member 150 is used when mounting wafer W on a wafer holder WH (refer to FIG. 2) to be described later on, or when carrying out wafer W mounted on wafer holder WH.

Center supporting member 150 has almost all portions except for a part of the tip placed within circular opening 36 formed in rectangular-shaped section 37 of X frame member 28. Center supporting member 150 has three vertical movement pins 140 fixed, respectively, to an upper surface of three tips of a pedestal member 146 which is Y-shaped in a planar view, and a vertical movement shaft (not shown) which has one end fixed to a center of a rear surface (lower surface) of pedestal member 146. To the upper surface of pedestal member 146, a plate member 141, which is rectangular-shaped in a planar view, is fixed. The three vertical movement pins 140 are inserted into holes which are not shown formed at wafer table WTB and wafer holder WH, and the upper surfaces are movable in a vertical direction between a first position located above the upper surface of wafer holder WH and a second position located below the upper surface of wafer holder WH.

At the upper surface (tip surface) of each of the three vertical movement pins 140, a suction port for vacuum suction (not shown) is formed, and the suction port communicates with a vacuum pump (not shown), via a pipe line and a vacuum piping which is not shown formed inside vertical movement pins 140 (and pedestal member 146). Center supporting member 150 is driven in the vertical direction by a driver 142 (refer to FIG. 10) via a vertical movement shaft which is not shown fixed to pedestal member 146.

Here, displacement in the Z-axis direction from a reference position of the three vertical movement pins 140 (center supporting member 150) is detected by a displacement sensor 145 (refer to FIG. 10), such as, for example, an encoder system provided at driver 142. Main controller 20, drives the three 3 vertical movement pins 140 (center supporting member 150) in the vertical direction, via driver 142, based on measurement values of displacement sensor 145.

On the upper surface of stage main section 81, wafer table WTB is placed as is shown in FIG. 1. Wafer table WTB is fixed to the upper surface of supporting member 25 previously described, via a bolt or the like. In this fixed state, wafer table WTB is in a non-contact state with respect to frame 26, the four support sections 49, and slider 22. Therefore, in the present embodiment, as the material of frame 26, the four support sections 49, and slider 22, a material which is not the same as supporting member 25 having a low thermal expansion coefficient, but a material which is light and also has high rigidity is used, such as, e.g., boron carbide ceramic.

Figure 2:
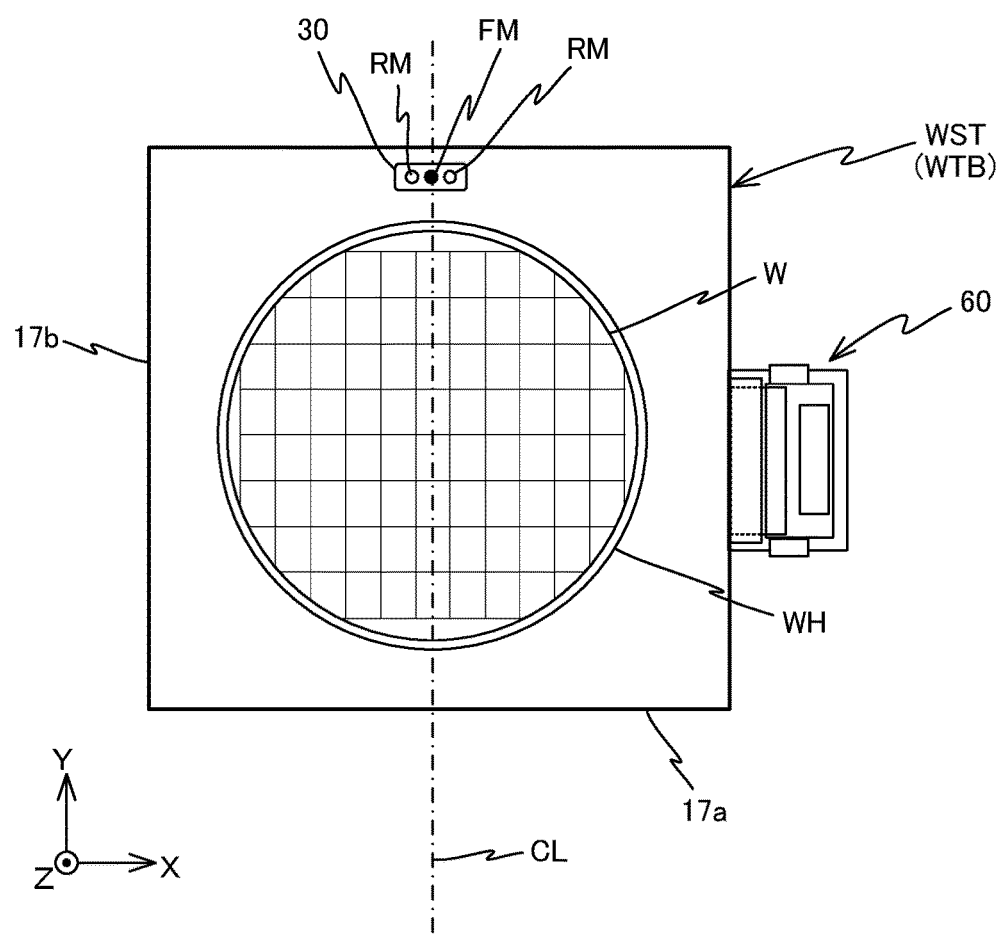
FIG. 2 is a planar view showing the wafer stage in FIG. 1.

For wafer table WTB, a material with a low thermal expansion coefficient as in a material having a thermal expansion coefficient the same as supporting member 25 is used, so that thermal stress deformation does not occur, especially due to the difference of thermal expansion force. In the center of the upper surface of wafer table WTB, wafer W is fixed by vacuum suction or the like, via wafer holder WH (not shown in FIG. 1, refer to FIG. 2) having a vacuum chuck (or an electrostatic chuck) or the like. Wafer holder WH may be formed integrally with wafer table WTB, however, in the present embodiment, wafer holder WH and wafer table WTB are structured separately and wafer holder WH is fixed onto wafer table WTB, for example, by vacuum suction or the like. Incidentally, while it is not shown in the drawings, in wafer table WTB and wafer holder WH, holes which are not shown are formed at positions corresponding to the three vertical movement pins 140 described above, and vertical movement pins 140 are vertically moved with respect to wafer table WTB and wafer holder WH, via the holes. Further, on the upper surface of wafer table WTB, as is shown in FIG. 2, a measurement plate (also called reference mark plate) 30 is provided near the +Y side edge. In this measurement plate 30, a first reference mark FM is provided at a center position coinciding with a center line CL wafer table WTB, and a pair of second reference marks RM for reticle alignment is provided with the first reference mark FM arranged in between.

To the −Y edge surface and −X edge surface of wafer table WTB, mirror-processing is applied, respectively, so as to form a reflection surface 17a and a reflection surface 17b shown in FIG. 2.

Figure 3:
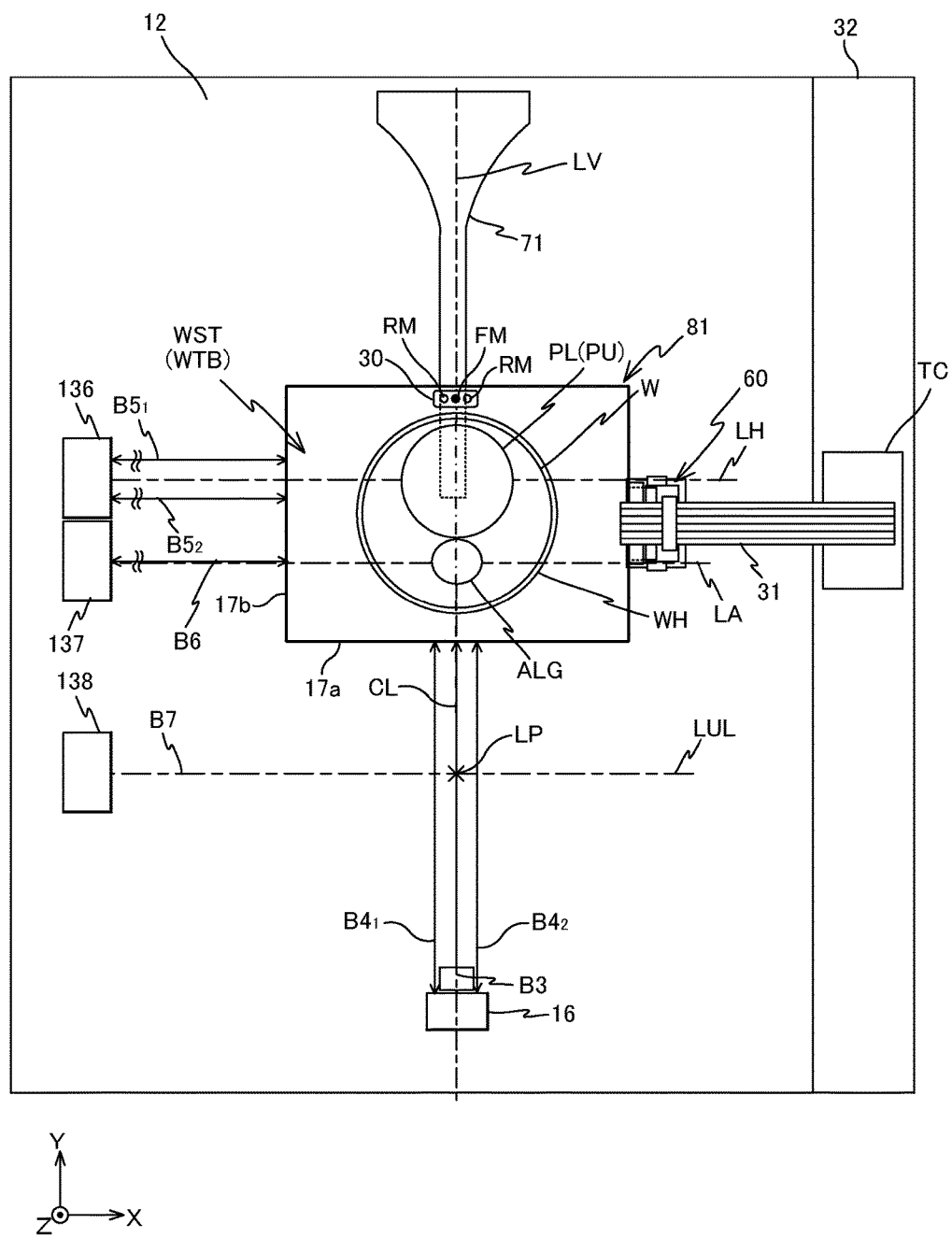

To the +X side surface of stage main section 81, as is shown in FIG. 3, one end of a tube 31 for power supply in which piping and wiring are integrated is connected, which is supported by a second stage member 42 to be described later on. The other end of tube 31 is connected to a tube carrier TC. Tube carrier TC supplies power supplied from power supply device 72 (refer to FIG. 10), such as electric power (electric current), compressed air and vacuum, and coolant, to wafer stage WST (stage main section 81 and the second stage member 42), via tube 31. Tube carrier TC is driven in the Y-axis direction by a carrier driving system 32 (refer to FIG. 10) consisting of a linear motor. The stator of the linear motor of carrier driving system 32 may be provided integral to a part of the +X edge of base board 12, as is shown in FIG. 3, or, may be provided at the +X side of base board 12 with the Y-axis direction serving as a longitudinal direction, separate to base board 12. When the stator is placed separate to base board 12, influence of the reaction force generated by the drive of tube carrier TC affecting wafer stage WST can be reduced.

Tube carrier TC is driven by main controller 20 in the Y-axis direction following wafer stage WST, via carrier driving system 32, however, the drive of tube carrier TC in the Y-axis direction does not have to strictly follow the drive of wafer stage WST in the Y-axis direction, and only has to follow within a permissible range.

The second stage device 60 is provided to prevent positioning accuracy of wafer stage WST (wafer W) from decreasing due to disturbance from tube 31. The second stage device 60 is provided in the center at the +X side surface of stage main section 81, as is shown in FIGS. 1 and 2 and the like.

Figure 7A:
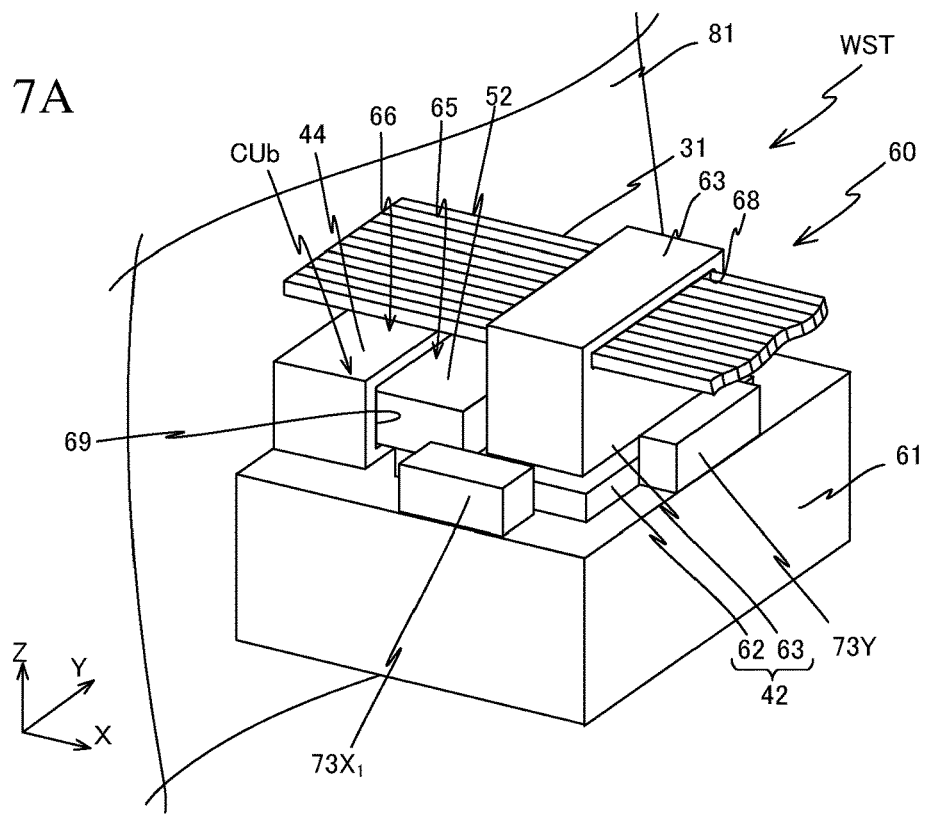
FIG. 7A is a perspective view schematically showing a structure of a second stage device that wafer stage in FIG. 2 is equipped with, and FIG. 7B shows an arrangement of a driving system and a position measurement system that the second stage device of FIG. 7A has.
Figure 7B:
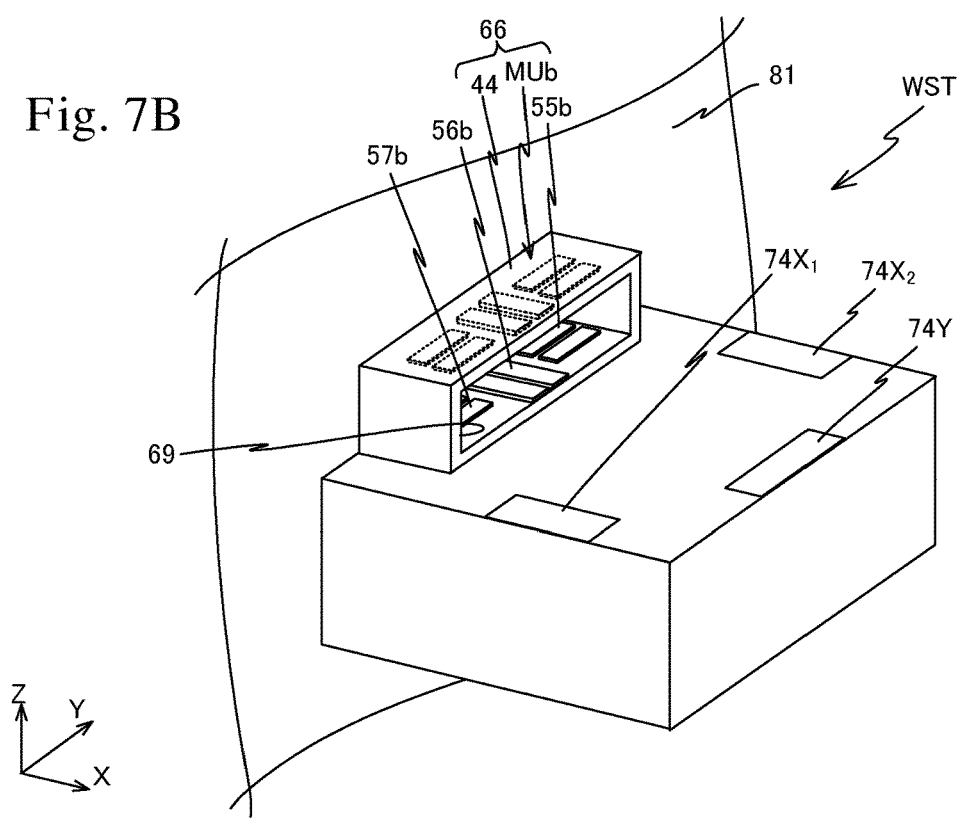

The second stage device 60, as is shown in FIGS. 7A and 7B, is equipped with a second stage base (hereinafter, shortened to a second base) 61 which projects from a surface on the +X side of stage main section 81 to the +X side, a second stage member 42 for tube clamping mounted on the second base 61, a driving system for driving the second stage member 42 with respect to the second base 61, a measurement system for measuring relative position between the second stage member 42 and the second base 61, namely, a position (ΔX, ΔY, Δθz) within the XY plane of the second stage member 42, with a predetermined point on the second base 61 serving as a reference, and the like.

The second base 61 has a rectangular solid shape having an upper surface and a lower surface parallel to the XY plane, and is provided in the center at the +X side surface of stage main section 81. The second base 61 may be formed integrally with stage main section 81, however, in this case, consists of a rectangular parallelepiped member fixed to stage main section 81. Inside second base 61, near the upper end surface of the +X side half part, a plurality of magnets (permanent magnets) which are not shown are placed two-dimensionally within the XY plane. The upper end surface of the second base 61 serves as a guide surface (movement plane) of the second stage member 42.

The second stage member 42 has a slider member (a second stage main section) 62 mounted in a non-contact manner on the second base 61, and a tube fixing member 63 fixed to the slider member 62 upper surface.

Slider member 62 consists of a plate member whose length in the X-axis direction is about half the second base 61 and the length in the Y-axis direction is slightly shorter than the second base 61, and is placed in the center in the Y-axis direction of the +X side half part on the second base 61 upper surface.

To slider member 62, a piping which structures a part of tube 31 is connected, and pressurized gas (e.g., compressed air) supplied from a gas supply device 94 (refer to FIG. 10) via the piping is made to be blown out toward the second base 61 from a supply port which is not shown formed at the lower surface (bottom surface) of slider member 62.

Further, at least a part of the (or the entire) lower surface side of slider member 62 is formed by a magnetic body member. Therefore, slider member 62 is magnetically suctioned by a magnet which is not shown within the second base 61. That is, in between slider member 62 and second base 61, a magnetic pre-load type air static pressure bearing (air bearing) is structured, which uses the upper surface of the second base 61 as a guide surface (movement plane). By this air static pressure bearing, slider member 62 is supported by levitation on the upper surface (guide surface) of the second base 61.

The flow or the like of the compressed air supplied from gas supply device 94 is controlled by main controller 20 (refer to FIG. 10), so that by the magnetic suction force and the static pressure of compressed air between slider member 62 and the second base 61 (bearing gap), or in other words the balance with the pressure in the gap, the bearing gap becomes a desired dimension and a sufficient rigidity will be secured.

Incidentally, in the present embodiment, although a magnetic pre-load type air static pressure bearing was structured in between slider member 62 and the second base 61, this is not limiting, and for example, a vacuum pre-load air static pressure bearing can also be structured. In the case the vacuum pre-load air static pressure bearing is structured, for example, an opening (space) can be formed further at a lower surface of slider member 62 at a position which does not interfere with a supply port which is not shown for compressed air blowout, and the space inside can be made to be a negative pressure via the vacuum device or the like.

Tube fixing member 63 consists of a rectangular parallelepiped member fixed to the +X side half part on the upper surface of slider member 62, and has a predetermined height (slightly higher than a stator section 66 to be described later on). Near the upper end of tube fixing member 63, a through hole 68 penetrating in the X-axis direction is formed covering almost the entire Y-axis direction. In through hole 68, tube 31 previously described whose one end is fixed to the +X side surface of stage main section 81 is inserted. The other end of tube 31 is connected to tube carrier TC.

In the present embodiment, tube 31 and through hole 68, for example, are substantially tightly fitted, and the one end of tube 31 inserted into through hole 68 is fixed to a side surface of stage main section 81 in a state where the −X side part is bent to some extent by tube fixing member 63. So, for example, even when tube 31 is driven by tube carrier TC and a part of the driving force is applied to wafer stage WST from tube 31 as a disturbance, the disturbance is applied to slider member 62 (the second stage member 42), via tube fixing member 63. Therefore, while free motion (movement) on the second base 61 of the second stage member 42 is allowed, stage main section 81 is hardly affected.

As is shown in FIGS. 7A and 7B, stator section 66 is fixed to the −X side edge on the upper surface of second base 61. Stator section 66 has a stator attaching member 44 consisting of a rectangular-shaped frame member elongated in the Y-axis direction when viewing from the +X direction, and a pair of magnet units MUb, each fixed to the inner surface of the upper wall section and the bottom wall section of stator attaching member 44. In a hollow section 69 formed at stator section 66, one end of a rectangular solid shaped mover section 65 is inserted.

Mover section 65 has a housing 52, and a coil unit CUb (refer to FIG. 8) housed at one end in the X-axis direction within housing 52. Coil unit CUb is placed at a position corresponding to the pair of magnet units MUb. Further, the lower surface at the other end in the X-axis direction of mover section 65 is fixed to the −X side half part of the upper surface of slider member 62. A voice coil motor Mb (refer to FIG. 8) is structured by coil unit CUb, and the pair of magnet units MUb that has coil unit CUb interposed vertically. Following is a description of voice coil motor Mb.

Figure 8:
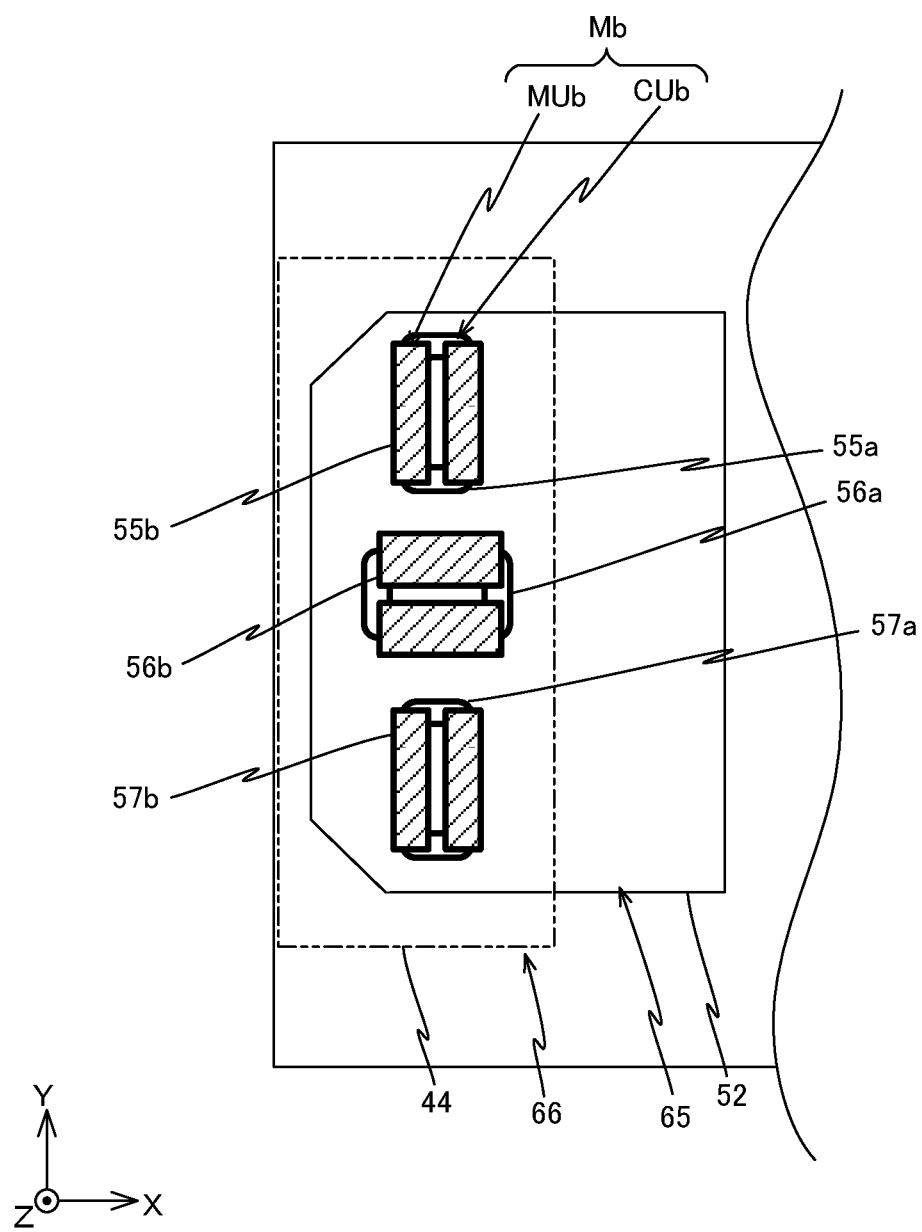
FIG. 8 is a view for describing a structure of a voice coil motor equipped in the second stage device in FIG. 7A.

FIG. 8 shows stator section 66 and mover section 65 placed on the second base 61 upper surface. Here, stator section 66 is shown in a virtual line. Coil unit CUb, as is shown in FIG. 8, includes one Y coil (hereinafter, appropriately called "coil") 56a, which is provided in the center of the Y-axis direction at the −X side edge inside housing 52 of mover section 65, and is rectangular-shaped in a planar view with the X-axis direction being the longitudinal direction, and two X coils (hereinafter, appropriately called "coils") 55a, 57a, which are placed, respectively, at one side and the other side in the Y-axis direction of coil 56a and are rectangular-shaped in a planar view with the Y-axis direction being the longitudinal direction.

The pair of magnet units MUb includes a pair each of (two pairs, a pair at the upper wall section and a pair at the bottom wall section) permanent magnets 56b, which have a rectangular shape in a planar view and are placed in the Y-axis direction with the longitudinal direction being the X-axis direction, at the center in the Y-axis direction on each of the inner surfaces of the upper wall section and the bottom wall section of stator attaching member 44 of stator section 66, and a pair each of (two pairs, a pair at the upper wall section and a pair at the bottom wall section) permanent magnets 55b, 57b, which have a rectangular shape in a planar view and are placed arranged in the X-axis direction with the longitudinal direction being the Y-axis direction at one side and the other side in the Y-axis direction of permanent magnets 56b.

Incidentally, in FIG. 8, although only magnet unit MUb fixed to the upper wall section of stator attaching member 44 is shown of the pair of magnet unit MUb, magnet unit MUb fixed to the bottom wall section of stator attaching member 44 is also similarly structured. Two pairs each of permanent magnets 55b, 56b, and 57b are set so that directions of magnetic poles are opposite for one and the other making a pair. And, each of the pair of magnet units MUb (a pair each of permanent magnets 55b, 57b, and 56b) faces the surface at the +Z side or the −Z side of coil unit CUb (coils 55a, 57a, and 56a).

By mover section 65 and stator section 66 having the structure described above, a triaxial voice coil motor Mb, which drives mover section 65 (the second stage member 42) in the X-axis direction, the Y-axis direction, and the θz direction with respect to stator section 66 (the second base 61), is structured. In this case, strictly speaking, although three voice coil motors are structured by a vertical pair of each of permanent magnets 55b, 56b, and 57b and each of coils 55a, 56a, 57a, for the sake of convenience on explanation, the whole three voice coil motors are regarded as one voice coil motor Mb. Drive in the θz direction is performed, by making the driving force differ in two voice coil motors that generate driving forces in the X-axis direction placed at the +Y side and the −Y side. Incidentally, driving force in the X-axis direction and the Y-axis direction of voice coil motor Mb is controlled (refer to FIG. 10) by main controller 20 controlling the magnitude and direction of electric current supplied to each coil structuring coil unit CUb.

Driving center (working point of the driving force) of the second stage member 42 by voice coil motor Mb coincides with the center of gravity (height position) of the whole wafer stage WST in the Z-axis direction. Further, the driving center is set at a position (or a position close) coinciding the center of gravity of the whole wafer stage WST also in the X-axis direction. Here, the driving center of wafer stage WST by planar motor 51A coincides with the center of gravity of wafer stage WST in the X-axis direction (and the Y-axis direction). Therefore, as for the X-axis direction, the driving center of the second stage member 42 by voice coil motor Mb coincides with the driving center of wafer stage WST by planar motor 51A.

Incidentally, instead of voice coil motor Mb, a voice coil motor (or a linear motor) of a two-step (or a multiple-step) structure similar to a fine movement stage driving system disclosed in, for example, U.S. Patent Application Publication No. 2010/0073653, may be employed. In such a case, the second stage member 42 can be finely driven in directions of five degrees of freedom (the X-axis, the Y-axis, the Z-axis, the θz, and the θx directions), in which the θy direction is excluded. Especially, the second stage member 42 can be driven in directions of six degrees of freedom, by arranging and placing in the X-axis direction in a pair, a vertical pair of XZ coils and a plurality of permanent magnets that face these coils vertically, and/or a vertical pair of YZ coils and a plurality of permanent magnets that face these coils vertically.

Figure 10:
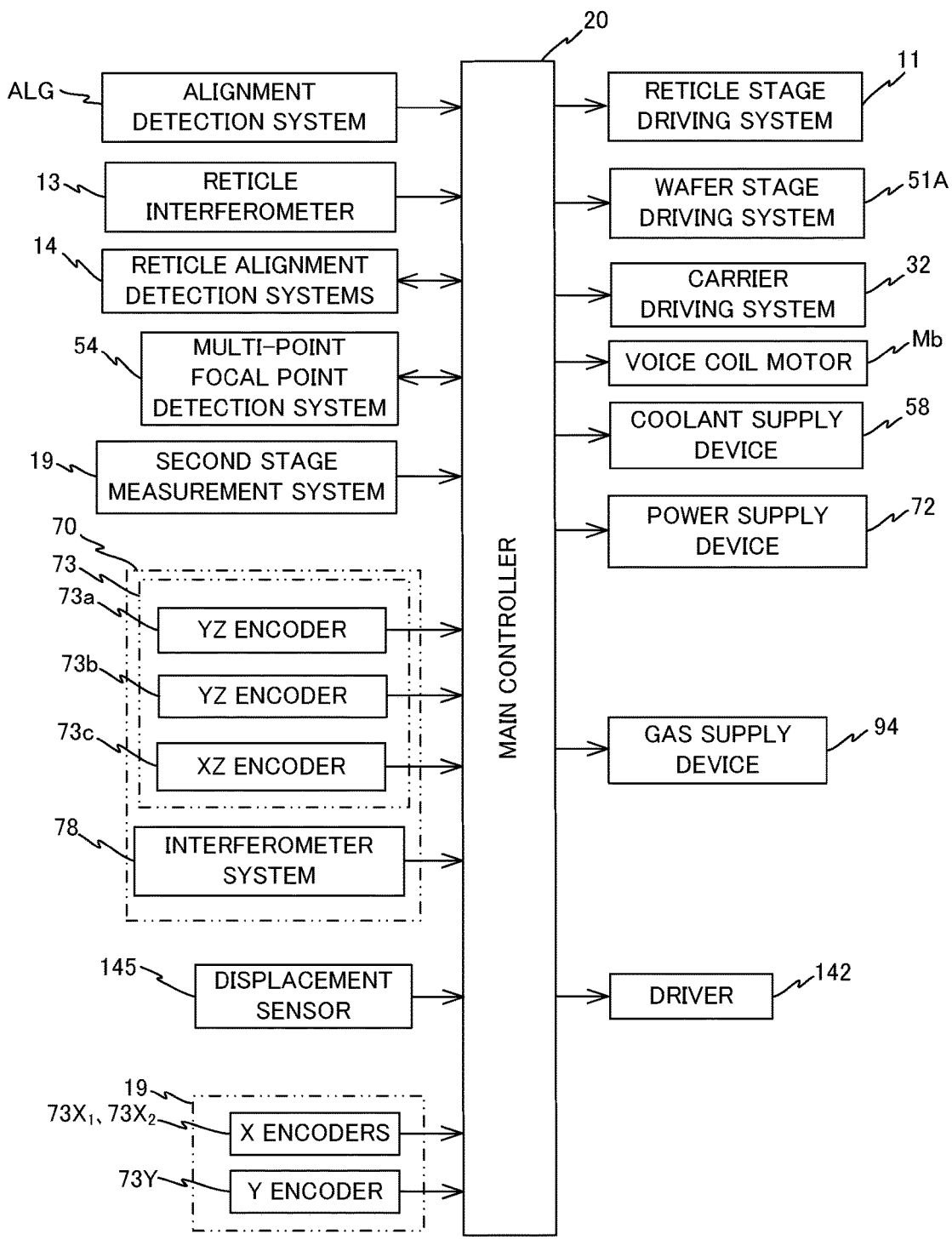
FIG. 10 is a block diagram showing an input/output relation of a main controller that mainly structures a control system of the exposure apparatus.

Further, the second stage device 60, as is shown in FIG. 10, is equipped with a second stage position measurement system (hereinafter, shortly referred to as a second stage measurement system) 19. The second stage measurement system 19 measures a position in the X-axis direction, the Y-axis direction with a predetermined point on the second base 61 as a reference, and a rotation amount (position information) in the θz direction of the second stage member 42.

The second stage measurement system 19, as is shown in FIGS. 7A and 7B, is equipped with a pair of X scales $74X_1$, $74X_2$ provided at both ends in the Y-axis direction and Y scale 74Y provided at the +X side edge on the upper surface of second base 61, and respectively facing X scales $74X_1$, $74X_2$, and Y scale 74Y, the second stage measurement system 19 is equipped with X heads $73X_1$, $73X_2$ (X head $73X_2$ is hidden in the depth of the page surface, therefore is not shown) fixed to both edge surfaces in the Y-axis direction and Y head 73Y fixed to the +X side surface of slider member 62.

On the upper surface of X scales $74X_1$, $74X_2$, a reflective diffraction grating (X diffractive grating) is formed whose a periodic direction is in the X-axis direction, and on the upper surface of Y scale 74Y, a reflective diffraction grating (Y diffractive grating) whose periodic direction is in the Y-axis direction is formed. Although the pitch of the grid lines is not shown for the X diffractive gratings and Y diffractive grating, the pitch can be set to, for example, 1 μm.

With X heads $73X_1$, $73X_2$, and X scales $74X_1$, $74X_2$, an X encoder (hereinafter referred to as X encoders $73X_1$, $73X_2$, using the same reference signs as X heads $73X_1$, $73X_2$) is structured whose measurement direction is in the X-axis direction. Similarly, with Y head 73Y and Y scale 74Y, a Y encoder (hereinafter referred to as Y encoder 73Y, using the same reference sign as Y head 73Y) is structured whose measurement direction is in the Y-axis direction. Measurement results of each of the X encoders $73X_1$, $73X_2$, and Y encoder 73Y are sent to main controller 20 (refer to FIG. 10). Incidentally, main controller 20 calculates the position in the X-axis direction and the rotation amount in the θz direction of the second stage member 42, with the predetermined point on the second base 61, or to be more specific, an intersecting point of a straight line (a straight line parallel to the Y-axis) connecting the center in the longitudinal direction of X scales $74X_1$, $74X_2$ and a straight line parallel to the X-axis that passes through the center in the longitudinal direction of Y scale 74Y, as a reference, based on the measurement results of the pair of X encoders $73X_1$, $73X_2$. Incidentally, in the present embodiment, X scales 74X₁, 74X₂ are placed symmetrical to the straight line parallel to the X-axis that passes through the center in the longitudinal direction of Y scale 74Y.

Further, main controller 20 calculates the position in the Y-axis direction of the second stage member 42, with the predetermined point on second base 61 described above as a reference, based on the measurement results of Y encoder 73Y. Incidentally, instead of using each encoder, the positional relation between the second base 61 and the second stage member 42 may be measured using, for example, an interferometer, a capacitance sensor or the like.

Next, a position measurement system 70 (refer to FIG. 10) that performs position measurement of wafer stage WST will be described.

Position measurement system 70 includes an encoder system 73 that is used when wafer stage WST is positioned near projection optical system PL (i.e., at the time of wafer alignment, and exposure operation by a step-and-scan method), and an interferometer system 78 that is used when the wafer stage is positioned outside the measurement range of encoder system 73, such as at the loading position.

Encoder system 73, as is shown in FIG. 1, is equipped with a measurement member (measurement arm 71), which is inserted into space 39 inside the wafer stage, in a state where wafer stage WST is placed below projection optical system PL. Measurement arm 71 is supported by main frame BD in a cantilevered manner (a part near one end is supported), via supporting member 76. Incidentally, when the measurement member employs a structure with which the movement of wafer stage WST is not interfered, then the support is not limited to the cantilevered manner, and the measurement member may be supported at both ends in the longitudinal direction.

Measurement arm 71 is equipped with an encoder head (optical system) which will be described later on, inside the tip. Measurement arm 71 consists of a hollow columnar member, which has a rectangular-shaped section whose longitudinal direction is in the Y-axis direction.

Measurement arm 71 is hollow, and widens at the base end (refer to FIG. 3). Further, optical fibers of a light-sending side (light source side) and a light-receiving side (detector side) that transmit light (measurement beam) between the encoder head to be described later on are inserted through the hollow section of measurement arm 71. Incidentally, the measurement arm 71 may be formed of a member that is hollow only at the portion where the optical fibers or the like pass through, and are solid at other portions.

As is previously described, in the state where wafer stage WST is placed below projection optical system PL, the tip of measurement arm 71 is inserted in to space 39 inside stage main section 81, and as is shown in FIG. 1, the upper surface of measurement arm 17 faces grating RG provided at the lower surface of supporting member 25. The upper surface of measurement arm 71 is placed substantially parallel to the lower surface of supporting member 25, in a state where a predetermined gap (gap, clearance), e.g., a gap of around several mm, is formed between the upper surface of measurement arm 71 and the lower surface of supporting member 25. Incidentally, the gap between the upper surface of measurement arm 71 and the lower surface of supporting member 25 may be equal to, or more than several mm, or less than several mm.

Encoder system 73, as an example, includes a pair of YZ encoders 73a, 73b that respectively measure the position of wafer table WTB in the Y-axis direction and the Z-axis direction, and an XZ encoder 73c that measures the position of wafer table WTB in the X-axis direction and the Z-axis direction, as is shown in FIG. 10.

The pair of YZ encoders 73a, 73b are each equipped with a two-dimensional head that is housed inside measurement arm 71, with the Y-axis direction and the Z-axis direction being the measurement direction, and XZ encoder 73c is equipped with a two-dimensional head that is housed inside measurement arm 71, with the measurement direction being the X-axis direction and the Z-axis direction. In the description below, for the sake of convenience, the two-dimensional head that the YZ encoders 73a, 73b, and XZ encoder 73c are respectively equipped with will be described as YZ heads 73a, 73b, and XZ head 73c, using the same reference signs as the respective encoders.

The measurement points (detection points) of the pair of YZ heads 73a, 73b are respectively set, for example, at points that are the same distance away in the X-axis direction from a point directly below the exposure position, which is the center of irradiation area (exposure area) IA of illumination light IL irradiated on wafer W. Further, XZ head 73c, for example, is set to a point that is a predetermined distance away in the Y-axis direction from the point directly below the exposure position.

As each of these YZ heads 73a, 73b, and XZ head 73c, an encoder head (hereinafter appropriately described as a head) having a structure similar to the displacement measurement sensor head disclosed in, for example, U.S. Pat. No. 7,561,280, can be used.

The output of encoders 73a, 73b, 73c of encoder system 73 is supplied to main controller 20 (refer to FIG. 10). Here, when the output of encoder system 73 is supplied to main controller 20, main controller 20 obtains the Y position, the θz rotation, and the θy rotation of wafer table WTB based on the measurement values of encoders 73a, 73b, obtains the X position of wafer table WTB based on the measurement values of encoder 73c, and obtains the θx rotation of wafer table WTB based on the measurement values of encoder 73a or 73b, and encoder 73c. In this manner, main controller 20 performs position measurement in directions of six degrees of freedom of the wafer table, using encoder system 73.

Incidentally, the structure of encoder system 73 is not limited to this. For example, as a combination of the encoder heads, an appropriate combination can be employed of a one-dimensional head, a two-dimensional head, and a three-dimensional head, and in short, only at least three measurement values in total in the X-axis direction and the Y-axis direction, and at least three measurement values in total in the Z-axis direction have to be acquired. Other than this, encoder system 73 may be structured combining a plurality of laser interferometers for measuring the position in the Z-axis direction, and a plurality of two-dimensional encoders (XY encoders) or one-dimensional encoders (X encoder, Y encoder), similar to the measurement arm disclosed in, for example, U.S. Patent Application Publication No. 2010/0296071.

Meanwhile, when wafer stage WST is located outside the measurement area of encoder system 73, the position information of wafer stage WST is measured by main controller 20, using interferometer system 78 (refer to FIG. 10).

Interferometer system 78 includes a plurality of interferometers that measure position information of wafer stage WST, or to be more specific, interferometers such as Y interferometer 16 and three X interferometers 136, 137, 138 as is shown in FIG. 3. In the present embodiment, as each interferometer described above, except for some interferometers, a multi-axis interferometer that has a plurality of measurement axes is used.

Y interferometer 16, as is shown in FIGS. 1 and 3, irradiates at least three measurement beams in the Y-axis direction including measurement beams $B4_1$, $B4_2$ that respectively pass optical paths distanced apart by the same distance to the −X side and the +X side from a straight line (hereinafter, called a reference axis) LV, which is parallel to the Y-axis that passes through the projection center (optical axis AX, also coinciding with the center of exposure area IA previously described in the present embodiment) of projection optical system PL, and a measurement beam B3 distanced apart from measurement beams $B4_1$, $B4_2$ in the −Z direction and passes above reference axis LV, on reflection surface 17a of wafer table WTB, and receives the respective reflected lights.

X interferometer 136 irradiates at least three measurement beams in the X-axis direction including measurement beams $B5_1$, $B5_2$ that respectively pass optical paths distanced apart by the same distance to the +Y side and the −Y side from a straight line (reference axis) LH in the X-axis direction which passes through the optical axis of projection optical system PL on reflection surface 17b of wafer table WTB, and receives the respective reflected lights.

X interferometer 137 irradiates at least two measurement beams in the X-axis direction that includes a measurement beam B6 passing through a straight line LA, which passes through the detection center of an alignment detection system ALG to be described later on and is parallel to the X-axis, on reflection surface 17b of wafer table WTB, and receives the respective reflected lights.

X interferometer 138 irradiates a measurement beam B7 along a straight line LUL, which passes through loading position LP where loading of the wafer is performed and is parallel to the X-axis, on reflection surface 17b of wafer table WTB, and receives the reflected light.

Measurement values (measurement results of position information) of each of the interferometers described above of interferometer system 78 are supplied to main controller 20 (refer to FIG. 10). Main controller 20, based on the measurement values of Y interferometer 16, obtains position information in the Y-axis direction, the θx direction, and the θz direction of wafer table WTB. Further, main controller 20, based on the measurement values of any one of X interferometers 136, 137, and 138, obtains position information in the X-axis direction of wafer table WTB. Further, main controller 20, based on the measurement values of X interferometer 136, obtains the position information in the θy direction of wafer table WTB. Incidentally, main controller 20 may obtain the position information in the θz direction of wafer table WTB, based on the measurement values of X interferometer 136.

Other than this, interferometer system 78 may be equipped with a pair of Z interferometers, placed apart by the same distance to the −X side and the +X side from reference axis LV, that irradiates a pair of measurement beams parallel to the Y-axis and spaced in the Z-axis direction on a pair of fixed mirrors (not shown), via a vertical pair of reflection surfaces of a movable mirror (not shown) fixed to a surface on the −Y side of stage main section 81, and receives the return lights from the pair of fixed mirrors via the reflection surfaces, the interferometers. Based on the measurement values of this pair of Z interferometers, main controller 20 can obtain the position information of wafer stage WST at least in directions of three degrees of freedom, including directions such as the Z-axis direction, the θy direction, and the θz direction.

Incidentally, details on the structure of interferometer system 78, and details on an example of the measurement method are disclosed in, for example, U.S. Patent Application Publication No. 2008/0106722 and the like.

Incidentally, while the interferometer system was used in the present embodiment for measuring the position information of wafer stage WST located outside the measurement area of encoder system 73, other means may also be used. For example, an encoder system like the one described in, U.S. Patent Application Publication No. 2010/0297562, can be used. In this case, for example, a two-dimensional scale can be placed at wafer table WTB, and an encoder head can be attached to the lower surface of main frame BD.

In exposure apparatus 10, as is shown furthermore in FIG. 1, alignment detection system ALG that detects the first reference mark FM previously described and alignment marks on wafer W is provided at a side surface at the lower end of barrel 40 of projection optical system PL. As alignment detection system ALG, for example, a FIA (Field Image Alignment) system of an image processing method is used, in which a broadband detection light beam that does not sensitize the resist on the wafer is irradiated on a subject mark, and with the reflected light from the subject mark, an image of the subject mark and an image of an index (an index pattern on an index plate provided within each alignment detection system) not shown are imaged, using an imaging element (such as a CCD), formed on the light-receiving plane, and imaging signals are output. The imaging signals from alignment detection system ALG are to be supplied to main controller 20 (refer to FIG. 10).

Incidentally, instead of alignment detection system ALG, an alignment device equipped with five alignment detection systems, as is disclosed in, for example, U.S. Patent Application Publication No. 2009/0233234, can be provided.

Other than this, in exposure apparatus 10, near projection optical system PL, there is provided a multi-point focal point detection system (hereinafter, referred to as multi-point AF system) 54 (refer to FIG. 10) that has an irradiation system 54a which irradiates a plurality of measurement beams on the surface of wafer W and a light-receiving system 54b which receives the respective reflection beams. Details on the structure of multi-point AF system 54 are disclosed in, for example, U.S. Pat. No. 5,448,332 and the like.

Although it is not shown in FIG. 1, above reticle R, a pair of reticle alignment detection systems 14 (refer to FIG. 10) is placed, of a TTR (Through The Reticle) method that uses the exposure wavelength for simultaneously observing a pair of reticle alignment marks on reticle R and an image via projection optical system PL of a pair of second reference marks RM on measurement plate 30 of wafer table WTB corresponding to the pair of reticle marks. Detection signals of this pair of reticle alignment detection systems 14 are to be supplied to main controller 20.

Here, while the description may vary in sequence, a first control system 59 will be described consisting of a part of the stage control system and controls the drive of wafer stage WST and the second stage member 42. Here, as an example, the first control system 59 is to control the drive of wafer stage WST and the second stage member 42 in directions of three degrees of freedom (X, Y, θz) in the XY plane.

Figure 9:
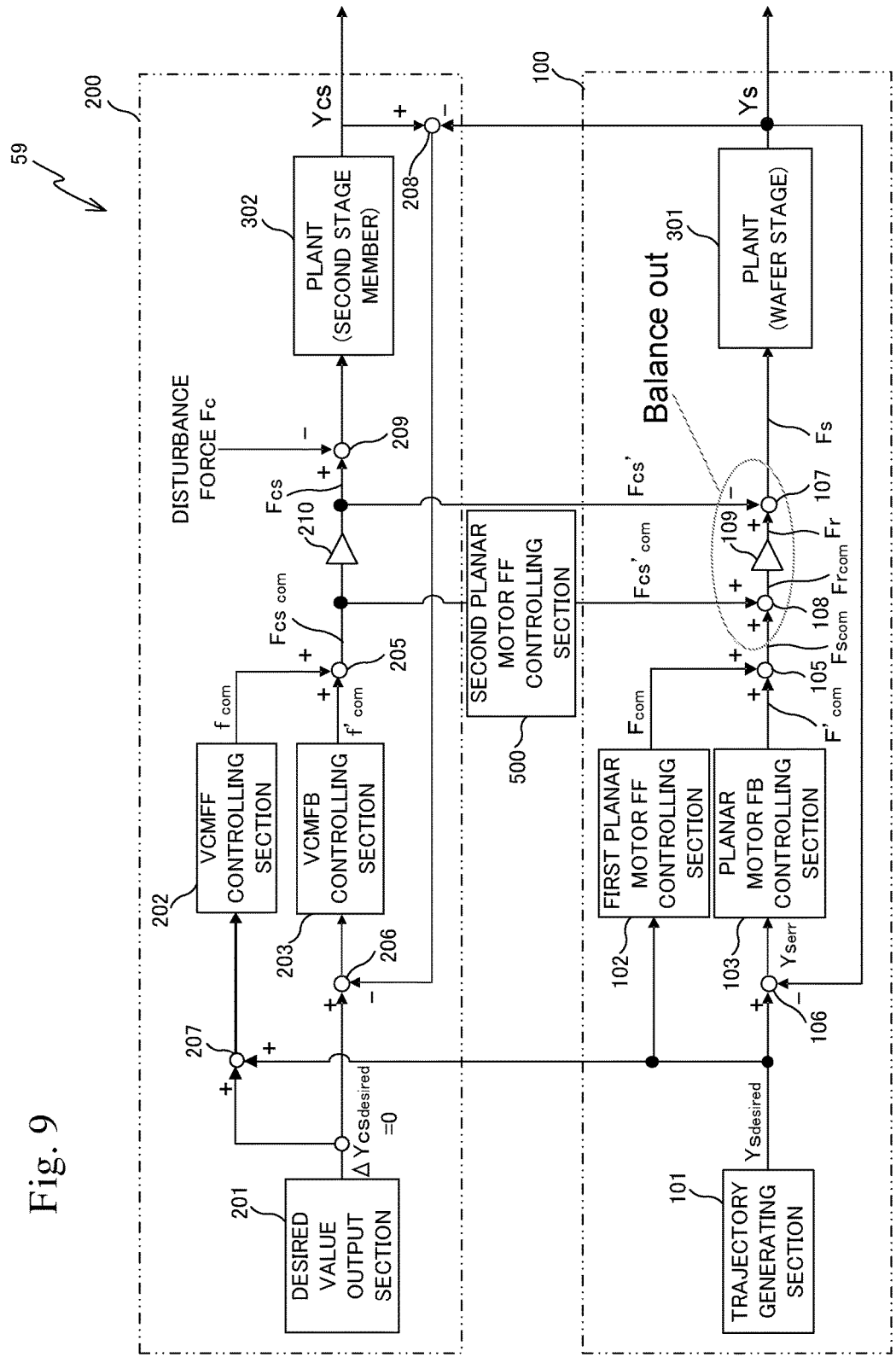
FIG. 9 is a block diagram showing a structure of a first control system that controls the planar motor driving the wafer stage and the voice coil motor driving the second stage member, along with the plant.

FIG. 9 shows a structure of the first control system 59 in a block diagram, along with the object to be controlled object. The first control system 59 drives wafer stage WST and the second stage member 42, using a generated target trajectory. The first control system 59 is built in main controller 20.

The first control system 59 is equipped with a first two degrees of freedom control system 100, a second two degrees of freedom control system 200, and a second planar motor feedforward control section 500 to be described later on.

The first two degrees of freedom control system 100 is a control system for drive control of wafer stage WST. The first two degrees of freedom control system 100 has a first planar motor feedforward control section 102 and a planar motor feedback control section 103, so that two different control characteristics can be set independently. Incidentally, in the description below, the feedback control section will be described shortly as FF controlling section, and feedback control section will be described shortly as FB controlling section.

The first two degrees of freedom control system 100 further has a trajectory generating section 101, adders 105, 108, subtractors 106, 107, and a conversion gain 109, and the like.

The second two degrees of freedom control system 200 is a control system for controlling the drive (including servo driving for maintaining the position with respect to wafer stage WST) of the second stage member 42. The second two degrees of freedom control system 200, similar to the first two degrees of freedom control system 100, has a VCMFF controlling section 202 and a VCMFB controlling section 203, so that two different control characteristics can be set independently. The second two degrees of freedom control system 200 further has a desired value output section 201, adders 205, and 207, subtractors 206, 208, and 209, and a conversion gain 210.

First of all, the first two degrees of freedom control system 100 will be described.

To trajectory generating section 101, position information in directions of three degrees of freedom (X, Y, θz) within the XY plane at a movement starting point of wafer stage WST and position information in directions of three degrees of freedom within the XY plane at a movement finishing point are input. The movement starting point shows the current position of wafer stage WST, and the movement finishing point shows the target position where wafer stage WST is to be moved. Here, the target trajectory in the θz direction is constantly zero. In the present embodiment, the driving center of wafer stage WST in the X, the Y, and the θz directions by planar motor 51A is to coincide with the center of gravity of the wafer stage. In this case, because the same thing can be said of the X, the Y, and the θz directions, hereinafter, the description will be made representatively on the control system which drives wafer stage WST in the Y-axis direction.

Trajectory generating section 101, based on the movement starting point and the movement finishing point that have been input, generates a target trajectory for moving wafer stage WST from the movement starting point to the movement finishing point. The target trajectory, for example, can be data sampled at a predetermined period (referred to as Tr), on position Y(t) of wafer stage WST made to associate with each time "t". Further, trajectory generating section 101 generates a target trajectory $Ys_{desired}$ for data not only on position, but also for each data on all states of controllable-canonical forms such as on velocity, acceleration, and the rate of change of acceleration (jerk).

The first planar motor FF controlling section 102, performs feedforward control on the Y coordinate position of wafer stage WST, based on a complete following control (refer to, for example, Japanese Patent Unexamined Application Publication No. 2001-325005, or the thesis "a complete following method using a multirate feedforward control" (Hiroshi Fujimoto et al., Transactions of the Society of Instrument and Control Engineers, Vol. 36(9), 766-772, 2000)), with the target trajectory described above on all states described earlier as an input only during the time corresponding to one sampling period Tr in trajectory generating section 101.

To be more specific, the first planar motor FF controlling section 102 holds (memorizes) an inverse system that shows a response inverse (relation between input/output is inverse) to a control model which reproduces the control characteristic of a plant 301 (wafer stage WST), and by using this inverse system, generates a driving signal (force command signal) $F_{com}$ for driving planar motor 51A. This driving signal $F_{com}$ is a control input from the first planar motor FF controlling section 102 with respect to plant 301. Incidentally, the first planar motor FF controlling section 102 is to take in an input at the sampling period Tr described above, and is to output the generated driving signal $F_{com}$ at a predetermined sampling period (described as Tu).

To planar motor FB controlling section 103, a calculation result of subtractor 106 is input. The calculation result of subtractor 106 is a difference (position deviation) $Ys_{err}$ between target trajectory $Ys_{desired}$ previously described generated at trajectory generating section 101 and Y position (Y position Ys obtained by encoder system 73 (or interferometer system 78) of position measurement system 70) of wafer stage WST.

Planar motor FB controlling section 103 performs feedback control on the Y coordinate position of wafer stage WST, based on the output of subtractor 106, that is, namely an error (position deviation) $Ys_{err}$ of the Y position of wafer stage WST, with target trajectory $Ys_{desired}$ as a reference. To be more specific, planar motor FB controlling section 103 generates a driving signal (force command signal) $F'_{com}$ for driving planar motor 51A so that position deviation $Ys_{err}$ described above becomes zero. This driving signal serves as a control input from planar motor FB controlling section 103 with respect to plant 301. Incidentally, reading of the Y position of wafer stage WST is performed at a predetermined sampling period (to be Ty), and furthermore, planar motor FB controlling section 103 is to take in an input at the predetermined sampling period Ty, and is to output the generated driving signal at the predetermined sampling period Tu.

The control input from the first planar motor FF controlling section 102, that is, driving signal $F_{com}$, and the control input from planar motor FB controlling section 103, that is, driving signal $F'_{com}$, are added by adder 105, and then, driving signal (force command signal) $Fs_{com}$, which is the control input after the addition, is given to adder 108.

Here, while the description may vary in sequence, the second two degrees of freedom control system 200 will be described.

The second two degrees of freedom control system 200, serving as a part equivalent to trajectory generating section 101 previously described, has desired value output section 201. Desired value output section 201 outputs a desired value $\Delta Ycs_{desired}$ of an offset amount (position deviation amount) of the second stage member 42 from a reference position on wafer stage WST. In the present embodiment, desired value output section 201 constantly outputs zero as the desired value $\Delta Ycs_{desired}$. However, the embodiment is not limited to this.

The calculation result of adder 207 is input to VCMFF controlling section 202. The calculation result of adder 207 is a result of adding desired value $\Delta Ycs_{desired}$ (=0) output from desired value output section 201 described above and target trajectory $Ys_{desired}$ generated by trajectory generating section 101 previously described. In this case, because desired value $\Delta Ycs_{desired}$ output from desired value output section 201 is constantly zero, the calculation result of adder 207 is target trajectory $Ys_{desired}$ itself, generated by trajectory generating section 101. VCMFF controlling section 202 performs feedforward control on the Y coordinate position of the second stage member 42 based on a complete following control, with respect to target trajectory $Ys_{desired}$ that adder 207 output, similarly to the first planar motor FF controlling section 102 of the first two degrees of freedom control system 100 described above.

To be more specific, VCMFF controlling section 202 holds (memorizes) an inverse system that shows a response inverse (relation between input/output is inverse) to a control model which reproduces the control characteristic of a plant 302 (second stage member 42), and by using this inverse system, generates a driving signal (force command signal) $f_{com}$ for driving voice coil motor Mb. This driving signal $f_{com}$ is a control input from VCMFF controlling section 202 with respect to plant 302 (second stage member 42). Incidentally, VCMFF controlling section 202 is to take in an input at the sampling period Tr described above, and is to output the generated driving signal at the predetermined sampling period Tu.

The calculation result of subtractor 206 is input to VCMFB controlling section 203. The calculation result of subtractor 206 is a difference between desired value $\Delta Ycs_{desired}$ (=0) output from desired value output section 201 and the calculation result of subtractor 208, and in this case, is the calculation result of subtractor 208 with the reference sign reversed. The calculation result of subtractor 208 is a difference between the current position of the second stage member 42 and the current position of wafer stage WST, and is equivalent to the position of the second stage member 42 that uses a reference point (the predetermined point previously described) on wafer stage WST as a reference. The calculation result of subtractor 208 is actually the Y position information of the second stage member 42 which is obtained from the measurement result of the second stage measurement system 19 (Y encoder 73Y). That is, to VCMFB controlling section 203, a Y coordinate value, which is the Y position (Y coordinate value) of the second stage member 42 obtained from the measurement result of the second stage measurement system 19 with the reference sign reversed, is actually input.

VCMFB controlling section 203 performs feedback control on the Y coordinate position of the second stage member 42, based on a Y coordinate value (error of the Y position of the second stage member 42 with respect to the predetermined point previously described) output from subtractor 206 described above. To be more specific, VCMFB controlling section 203 generates a driving signal (force command signal) $f'_{com}$ for driving voice coil motor Mb, so that the Y coordinate value (error of the Y position of the second stage member 42 with respect to the predetermined point previously described) of the second stage member 42 described above becomes zero. This driving signal (force command signal) $f'_{com}$ is a control input from VCMFB controlling section 203 with respect to plant 302 (second stage member 42). Incidentally, reading of the Y position of the second stage member 42 is performed at the predetermined sampling period Ty, and further, VCMFB controlling section 203 is to output the generated driving signal at the predetermined sampling period Tu.

The control input from VCMFF controlling section 202, i.e., driving signal $f_{com}$, and the control input from VCMFB controlling section 203, i.e., driving signal $f'_{com}$, are added by adder 205, and a driving signal (force command signal) $Fcs_{com}$, which is the control input after the addition, is given to conversion gain 210. Conversion gain 210 is a gain that converts driving signal (force command signal) $Fcs_{com}$ to a corresponding force Fcs (a force applied to plant 302 (the second stage member 42)), and actually, equivalent to this are voice coil motor Mb serving as an actuator and its driving amplifier.

In the present embodiment, as is previously described, a part near one end of tube 31 is connected to the second stage member 42. Therefore, when wafer stage WST is driven, the second stage member 42 drags tube 31, which causes tension or the like of tube 31 to act on the second stage member 42 as a disturbance (disturbance force). FIG. 9 shows the action of the disturbance force described above, by an arrow showing that a disturbance force (a force applied from tube 31 to the second stage member 42) Fc caused by tube 31 is input to subtractor 209, to which an output of conversion gain 210, i.e., force (thrust) Fcs applied from voice coil motor Mb to plant 302 (the second stage member 42) is input. As it can be seen from this FIG. 9, the force acting on the second stage member 42 includes thrust Fcs and disturbance force (tube load resistance) Fc. Here, the reason why subtractor 209 is used instead of the adder is because the direction of thrust and the direction of disturbance force Fc are in opposite directions.

However, a controlled variable (a Y coordinate value of the second stage member 42), which is obtained as a result of plant 302 (the second stage member 42) being driven by a force including the disturbance force (tube load resistance) Fc described above, is fed back to subtractor 206, and the driving signal (force command signal) $f'_{com}$ computed by VCMFB controlling section 203 is a control input that reduces or cancels the disturbance force described above. Incidentally, when characteristics and the like of the disturbance described above is known, the control input computed by VCMFF controlling section 202, which performs control of the drive of the second stage member 42 by complete following control, can be a control input which reduces or cancels the disturbance force described above.

In the present embodiment, because the second stage member 42 is driven by voice coil motor Mb which has stator section 66 (a pair of magnet units MUb) provided at wafer stage WST and mover section 65 (coil unit CUb) provided at the second stage member 42, when voice coil motor Mb generates a driving force for driving the second stage member 42, a reaction force of the driving force acts on wafer stage WST. This reaction force becomes a force that drives wafer stage WST in directions such as the X-axis direction, the Y-axis direction, and the θz direction, which becomes an obstacle to position control of wafer stage WST. FIG. 9 shows a state where this reaction force is applied to wafer stage WST, by an arrow indicating that a force Fcs' is input to subtractor 107, to which a force Fr being an output of conversion gain 109 to be described later on is input. That is, input Fcs' to subtractor 107 shows the force acting on wafer stage WST by the drive of the second stage member 42 during the operation of wafer stage WST, i.e., while scanning or stepping is performed.

Incidentally, since the driving center in the Y-axis direction of the second stage member 42 by voice coil motor Mb, i.e., the working point on wafer stage WST of the reaction force of the driving force in the Y-axis direction, and the center of gravity of wafer stage WST are different, the reaction force of the force Fcs applied to the driving center of the second stage member 42 by voice coil motor Mb acts on the center of gravity of wafer stage WST as force Fcs' as a kind of a force after a coordinate conversion. That is, this is shown conceptually in FIG. 9, by force Fcs' being input to subtractor 107 instead of force Fcs.

In the present embodiment, a second planar motor FF controlling section 500 is provided for the purpose of cancelling the force, which becomes an obstacle to position control of wafer stage WST, caused by the reaction force described above. To the second planar motor FF controlling section 500, as is shown in FIG. 9, an output of adder 205, i.e., the driving signal (force command signal) $Fcs_{com}$ previously described, which is the control input to plant 302 (the second stage member 42), is input. Based on driving signal (force command signal) $Fcs_{com}$ which has been input, the second planar motor FF controlling section 500, when the driving signal (force command signal) $Fcs_{com}$ is given, performs a kind of coordinate converting operation, based on the driving force generated by voice coil motor Mb and the driving center of the second stage member 42 by voice coil motor Mb, i.e., a difference of position between the working point on wafer stage WST of the reaction force of the driving force and the driving center (in this case, the center of gravity of wafer stage WST) of wafer stage WST by planar motor 51A, and computes a control input, i.e., a driving signal (force command signal) $Fcs'_{com}$, for cancelling the reaction force of the driving force that the second stage member 42 generates, and gives the driving signal to adder 108.

Adder 108 gives a control input to plant 301 (wafer stage WST) output from adder 105, i.e., driving signal $Fr_{com}$, which is an addition of the driving signal (force command signal) $Fs_{com}$ and the driving signal (force command signal) $Fcs'_{com}$ described above, to conversion gain 109.

Conversion gain 109 is a gain that converts driving signal (force command signal) $Fr_{com}$ to a corresponding force (thrust) Fr (a force applied to plant 301 (wafer stage WST)), and actually, equivalent to this are planar motor 51A serving as an actuator and its driving amplifier.

Force Fr, which is the output of conversion gain 109, is given to subtractor 107, and at subtractor 107, a force Fs, which is force Fr reduced by force Fcs' previously described, is calculated, and is given to plant 301 (wafer stage WST).

Here, in correspondence with $Fr_{com}=Fs_{com}+Fcs'_{com}$, the relation of Fr=Fs+Fcs' is valid.

Accordingly, the reaction force (the force after coordinate conversion) −Fcs' previously described applied to wafer stage WST is canceled out by force Fcs' after conversion by conversion gain 109 of the driving signal (force command signal) $Fcs'_{com}$ calculated at the second planar motor FF controlling section 500. "Balance Out" surrounded by an ellipse in FIG. 9 conceptually shows a situation in which the reaction force described here is cancelled out.

In brief, in the present embodiment, disturbance force Fc acting on the second stage member 42 from tube 31 is distracted from force (thrust) Fcs by subtractor 209, and force Fcs' acting on the center of gravity of wafer stage WST due to force (thrust) Fcs is subtracted from force (thrust) Fr by subtractor 107. In this manner, the influence of (the force caused by) reaction force Fcs of the driving force of the second stage member 42 with respect to wafer stage WST is cancelled out. As a result of the reaction force being cancelled out, the second stage member 42 maintains position ΔYcs=Ycs−Ys in a desired range, and wafer stage WST moves without showing any influence of load resistance (disturbance force Fc) by tube 31 on predetermined position Ys. That is, in the present embodiment, the load resistance not known by tube 31 is extracted by applying an opposite force equally to the second stage member 42, and then, the force calculated by an operation including a coordinate converting operation based on this known force is added to the desired thrust with respect to wafer stage WST. In this manner, the force caused by the reaction force of the driving force of voice coil motor Mb applied to wafer stage WST is cancelled out by a force corresponding to the control input computed by the second planar motor FF controlling section 500.

As is described above, in the first two degrees of freedom control system 100, plant 301 (wafer stage WST) is controlled and driven similarly to the case when there is no influence of the reaction force described above. That is, the drive and control of plant 301 (wafer stage WST), i.e., driving of wafer stage WST via planar motor 51A, is performed, based on control input $Fs_{com}$ that is the output of adder 105, in which the control input from the first planar motor FF controlling section 102 and the control input from the planar motor FB controlling section 103 are added.

Incidentally, for the X-axis direction, the drive and control of wafer stage WST and the drive and control of the second stage member 42 are performed similarly to the control of the Y-axis direction described above. However, when the driving center in the X-axis direction of the second stage member 42 by voice coil motor Mb coincides with the center of gravity of wafer stage WST, the reaction force of force Fcs acts straightly on the center of gravity of wafer stage WST. Therefore, driving signal $Fcs_{com}$ which is the output of adder 205 only has to be input to adder 108 without change, and without the second planar motor FF controlling section 500 being provided. Meanwhile, when the driving center in the X-axis direction of the second stage member 42 by voice coil motor Mb does not coincide with the center of gravity of wafer stage WST, the second planar motor FF controlling section 500 as is previously described should be provided.

Further, for the remaining θz direction, except for the point that the output from trajectory generating section 101 is constantly zero, the drive and control of wafer stage WST and the drive and control of the second stage member 42 are performed similarly to the control of the Y-axis direction described above.

FIG. 10 shows a block diagram that shows an input/output relation of main controller 20 that mainly structures the control system of exposure apparatus 10 and has overall control of each section. Main controller 20 includes parts such as a workstation (or a microcomputer), and has overall control over each section of exposure apparatus 10.

As is obvious from the description so far, in the present embodiment, wafer stage WST, the second stage device 60 (including the second stage measurement system 19), planar motor 51A, voice coil motor Mb, position measurement system 70, wafer center supporting member 150, and driver 142 structure a stage device 85 (refer to FIG. 1).

In exposure apparatus 10 related to the present embodiment structured as is described above, main controller 20 performs a series of processing as is described below.

That is, main controller 20 firstly loads reticle R on reticle stage RST, using a reticle carrier system (not shown). Further, main controller 20 loads wafer W on wafer stage WST (wafer holder WH), using a wafer carrier system (not shown). This loading of the wafer is performed in the order described below.

Wafer stage WST is driven to a loading position. Wafer W is carried by a carrier arm to an area above wafer stage WST. Center supporting member 150 (three vertical movement pins 140) is driven upward by driver 142, and after wafer W is delivered to the three vertical movement pins 140 from the carrier arm, the carrier arm is withdrawn. Then, by driver 142, center supporting member 150 (three vertical movement pins 140) is driven downward, and wafer W is mounted on wafer holder WH. Then, wafer W is suctioned by wafer holder WH.

After the loading of wafer W, main controller 20 performs preparatory operations such as reticle alignment, base line measurement of alignment detection system ALG, and wafer alignment (for example, EGA), using the pair of reticle alignment detection systems 14, measurement plate 30, and alignment detection system ALG. Incidentally, operations such as reticle alignment and base line measurement are disclosed in detail in, U.S. Pat. No. 5,646,413. Further, as for EGA, the operation is disclosed in detail in U.S. Pat. No. 4,780,617. Here, EGA refers to an alignment method in which array coordinates of all shot areas on wafer W are obtained by a statistical calculation utilizing the least squares method disclosed in, for example, the U.S. patent specification described above, with the use of position detection data of wafer alignment marks provided at a plurality of shot areas which are selected among a plurality of shot areas on wafer W.

Then, by repeating a moving operation between shots to move wafer stage WST to a scanning starting position (acceleration starting position) for exposure of each shot area on wafer W and a scanning exposure operation to transfer the pattern of reticle R to each shot area by the scanning exposure method based on the results of reticle alignment, base line measurement, and wafer alignment, main controller 20 performs exposure by the step-and-scan method on a plurality of shot areas on wafer W. Focus-leveling control of wafer W during exposure is performed in a real-time manner, using multi-point AF system 54 previously described.

During the series of processing described above, wafer stage WST is driven by main controller 20, via stage driving system (planar motor) 51A. At the time of this drive of wafer stage WST, in order to keep the positioning accuracy of wafer stage WST (wafer table WTB) from decreasing by an external force from tube 31 applied to wafer stage WST, main controller 20 (the first control system 59) controls the second stage member 42 (voice coil motor Mb) and stage driving system (planar motor) 51A in the manner previously described. Here, as cases in which the external force from tube 31 applied to wafer stage WST affects the positioning accuracy of wafer stage WST (wafer table WTB), a case when wafer stage WST and tube carrier TC move relatively in the X-axis direction and a case when follow-up delay is generated of tube carrier TC to wafer stage WST when moving in the Y-axis direction, can be considered representatively.

Further, when vibration of a high frequency region (disturbance) travels to wafer stage WST such as when wafer stage WST is being driven, while supporting member 25 fixed by the six rod members $23_1$ to $23_3$, and $24_1$ to $24_3$ vibrates in accordance with the disturbance, the vibration of supporting member 25 is attenuated sufficiently by the pair of coupling members 29 that function as a squeeze damper and face edges 25c of supporting member 25 via a slight gap (gap, clearance).

As is described so far, in wafer stage WST related to the present embodiment and exposure apparatus 10 equipped with the wafer stage, wafer table WTB (wafer holder WH) is mounted on the upper surface of supporting member 25 in a non-contact manner with frame 26. And, supporting member 25 is substantially fixed kinematically on slider 22 which is driven on base board 12, via the six rod members $23_1$ to $23_3$, and $24_1$ to $24_3$. This sufficiently reduces deformation of supporting member 25 and wafer table WTB, caused by deformation of slider 22 (e.g., deformation (so-called bimetallic effect) caused by thermal stress due to the difference in thermal expansion coefficient between slider 22 and permanent magnet 18, other variations of deformation) when wafer stage WST is driven.

Further, wafer center supporting member 150 and driver 142 which are used when wafer W is mounted on wafer stage WST, or when wafer W is separated from wafer stage WST, are mounted on frame 26 distanced (non-contact) from supporting member 25 to which wafer table WTB is fixed. Therefore, vibration generated when center supporting member 150 (three vertical movement pins 140) is driven and heat generated by driver 142 can be kept from travelling to supporting member 25 and wafer table WTB. This makes it possible to prevent the exposure accuracy from decreasing.

Further, when supporting member 25 vibrates in a yawing, a pitching, a rolling, and the Z-axis direction by vibration of the harmonic wave generated when wafer stage WST is driven, because a pair of coupling members that function as a squeeze damper is provided, facing edges 25c provided at both ends in the Y-axis direction of supporting member 25 extending in the X-axis direction, via a slight gap in a non-contact manner, the vibration of the harmonic wave applied to supporting member 25 and wafer table WTB can be effectively attenuated. This makes it possible to prevent the exposure accuracy from decreasing.

Further, because the six rod members $23_1$ to $23_3$, and $24_1$ to $24_3$, which are placed on slider 22 and support from below supporting member 25, are placed so that at least two rods of the rod members $23_1$ to $23_3$, and $24_1$ to $24_3$ intersect each other when viewed from any direction, in a planar view, a side surface view, and a front view, rigidity can be sufficiently secured, not only in the cross-scanning direction but also in the scanning direction.

Further, inside slider 22, because a coolant is supplied in a passage not shown, the thermal deformation of slider 22 can be effectively restrained.

Further, in the present embodiment related to second stage device 60 and exposure apparatus 10 equipped with this device, because disturbance from tube 31 is applied to the second stage member 42 (tube fixing member 63), the disturbance does not act directly on wafer stage WST. Further, because the second stage member 42 is supported by levitation on the second base 61 that structures a part of wafer stage WST, movement (positional deviation) in the X, the Y, and the θz directions of the second base 61 with respect to a reference position (predetermined point), which is caused by the disturbance acting on the second stage member 42, is allowed. Accordingly, when the second stage member 42 is returned to its original position before the positional deviation exceeds a permissible range, then the disturbance from tube 31 will not have any adverse effect on position controllability of wafer stage WST.

Further, according to exposure apparatus 10 related to the present embodiment, because voice coil motor Mb generates a driving force to return the second stage member 42 to its original position, a reaction force of the driving force acts on wafer stage WST on which stator section 66 of voice coil motor Mb is provided, however, main controller 20 (the second planar motor FF controlling section 500) generates a force, separately with the driving force according to the target trajectory, to cancel out the influence of this reaction force, via planar motor 51A, therefore, wafer stage WST will not be affected by the reaction force.

Further, according to exposure apparatus 10 related to the embodiment described above, as is previously described, by the first control system 59 equipped with the first two degrees of freedom control system 100, the second two degrees of freedom control system 200, and the second planar motor FF controlling section 500, plant 301 of the first two degrees of freedom control system 100, namely, wafer stage WST can be driven with good accuracy along the target trajectory, without being affected by the disturbance of tube 31.

According to exposure apparatus 10 related to the present embodiment, as a result of the various effects described above, with wafer stage WST, it becomes possible to improve positioning accuracy, to perform a highly precise exposure with respect to wafer W, and to transfer the pattern of reticle R onto wafer W with good precision.

Incidentally, in the embodiment above, an example has been described of a case where a vibration-damping section for attenuating the vibration of supporting member 25 and wafer table WTB fixed to supporting member 25 is structured by the squeeze film damper formed between the pair of edges 25c, which is a part of supporting member 25, and the pair of coupling members 29, which is a part of frame 26. However, the vibration-damping section attenuating the vibration of supporting member 25 and wafer table WTB fixed to supporting member 25 does not have to be a squeeze film damper, as long as it is provided in between a part of the stage main section 81 (hereinafter referred to as a base section of stage main section 81) and supporting member 25, the stage main section 81 consisting of slider 22 where magnet unit (magnet 18) is provided and a member structured integrally with the slider. While the squeeze film damper described in the embodiment above attenuates the vibration of supporting member 25 using flow and compression of viscous air (a kind of fluid) that exists between supporting member 25 and frame 26, this is not limiting, and the vibration-damping section which attenuates the vibration of supporting member 25 may be provided between a part of the base section of stage main section 81, e.g., frame 26, and supporting member 25, using either the flow or the compression of the fluid.

Incidentally, in the embodiment above, the case has been described where the first control system 59 previously described was employed as the control system, and by the first control system 59, disturbance force Fc from tube 31 was totally cancelled out, via voice coil motor Mb and planar motor 51A. However, the structure of the control system is not limited to the structure similar to the first control system 59 previously described. Further, for example, a part of the disturbance force may be cancelled.

Further, by tube 31 being fixed and a member (the second stage member 42 in the embodiment above) being provided that can move with respect to wafer stage WST by the action of disturbance force Fc from tube 31, the disturbance force from tube 31 will no longer be applied directly to wafer stage WST. Accordingly, the control of the second stage member 42 (voice coil motor Mb) and wafer stage WST (planar motor 51A) tube 31 to cancel out the disturbance force does not necessarily have to be performed.

Further, in the embodiment above, for the sake of simplicity of the description, while the case has been described where the second stage member 42 and wafer stage WST was driven in three degrees of freedom, the X, the Y, and the θz directions by the first control system 59, the embodiment is not limited to this, and since wafer stage WST can be driven in directions of six degrees of freedom, which are the X, the Y, the Z, the θx, the θy, and θz directions, by planar motor 51A, a control system having a structure similar to the structure of the first control system 59 may naturally be employed to control and drive the second stage member 42 and wafer stage WST in directions of six degrees of freedom. In this control system, the trajectory generating section can be made to constantly generate a constant value as the target trajectory in the Z-axis direction, and to constantly generate a zero as the target trajectory in the θx and the θy directions, and the desired value output section can be made to output zero as the desired value in all directions of six degrees of freedom.

Incidentally, in the embodiment above, an example was described of the case when the first planar motor FF controlling section 102 and VCMFF controlling section 202 both perform complete following control. However, the embodiment is not limited to this, and the first planar motor FF controlling section 102 only has to perform feedforward control on the position of wafer stage WST based on the target trajectory of wafer stage WST, and does not necessarily have to perform the complete following control. Similarly, VCMFF controlling section 202 only has to perform feedforward control on the position of the second stage member 42 on which the disturbance from tube 31 acts with respect to wafer stage WST, based on the target trajectory, and does not necessarily have to perform the complete following control.

Further, in the embodiment described above, while the second stage member 42 was provided at the +X side surface of wafer stage WST, the embodiment is not limited to this, and the second stage member 42 can be provided at any side surface of wafer stage WST, or, for example, a space can be formed in the center of wafer stage WST, and the second stage member 42 may be provided in the space. Further, the second stage member 42 necessarily does not have to be one, and a plurality of (e.g., two) members may be provided.

Further, in the embodiment above, while the case has been described where the exposure apparatus is a dry type exposure apparatus that performs exposure of wafer W without exposing through liquid (water), the embodiment is not limited to this, and the embodiment described above may naturally be applied to a liquid immersion type exposure apparatus that performs exposure of the wafer via an optical system and liquid.

Incidentally, in the embodiment above, while the case has been described where the exposure apparatus is a scanning stepper, the embodiment is not limited to this, and the embodiment above may be applied to a stationary type exposure apparatus, such as a stepper. Further, the embodiment above can be applied to a step-and-stitch reduction projection exposure apparatus that synthesizes a shot area and a shot area.

Further, the projection optical system of the projection exposure apparatus in the embodiment abode is not limited to a reduction system, and may be an equal magnifying, or a magnifying system, and the projection optical system is not limited to a refractive system, and may also be a reflection system or a catadioptric system, and the projection image be an inverted image or an erected image.

Further, illumination light IL is not limited to an ArF excimer laser beam (wavelength 193 nm), and may be ultraviolet light such as a KrF excimer laser beam (wavelength 248 nm), or a vacuum-ultraviolet light such as a F2 laser beam (wavelength 157 nm). As is disclosed in, for example, U.S. Pat. No. 7,023,610, a harmonic wave may be used, in which an infrared or a visible range single-wavelength laser beam emitted by a DFB semiconductor laser or a fiber laser as a vacuum-ultraviolet light is amplified by a fiber amplifier doped with, e.g., erbium (or both erbium and ytterbium), and wavelength conversion to an ultraviolet light is performed using a nonlinear optical crystal.

Further, in the embodiment above, illumination light IL of the exposure apparatus is not limited to the light having a wavelength equal to or more than 100 nm, and it is needless to say that the light having a wavelength less than 100 nm may be used. For example, the embodiment above can be applied, also to an EUV exposure apparatus that uses EUV (Extreme Ultraviolet) light in the soft X-ray region (e.g., wavelength band of 5 to 15 nm). Other than this, the embodiment above can be applied, also to an exposure apparatus that uses charged particle beams such as an electron beam or an ion beam.

Further, in the embodiment above, while a transmissive mask (reticle), which is a transmissive substrate on which a predetermined light shielding pattern (or a phase pattern or a light attenuation pattern) is formed, was used, instead of this reticle, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed may also be used.

Further, as is disclosed in, for example, International Publication No. WO 2001/035168, the embodiment above can also be applied to an exposure apparatus (lithography system) that forms a line-and-space pattern on wafer W by forming interference fringes on wafer W.

Furthermore, as is disclosed in, for example, U.S. Pat. No. 6,611,316, the embodiment above can also be applied to an exposure apparatus that synthesizes two reticle patterns on a wafer via a projection optical system, and almost simultaneously performs double exposure on a shot area on the wafer by performing scanning exposure once.

Incidentally, the object on which a pattern is to be formed (the object subject to exposure to which an energy beam is irradiated) in the embodiment above is not limited to a wafer, and can be other objects such as a glass plate, a ceramic substrate, a film member, or a mask blank.

The use of the exposure apparatus is not limited only to the exposure apparatus for manufacturing semiconductors, but the embodiment above can also be widely applied, for example, to an exposure apparatus for transferring a liquid crystal display devices pattern onto a square-shaped glass plate, or to an exposure apparatus that produces parts such as organic ELs, thin-film magnetic heads, imaging devices (such as CCDs), micromachines, and DNA chips. Further, the embodiment above can be applied not only to the exposure apparatus that produces microdevices such as semiconductor devices, but also to an exposure apparatus that transfers a circuit pattern onto a glass substrate or silicon wafer to produce a reticle or mask used in a light exposure apparatus, an EUV exposure apparatus, an X-ray exposure apparatus, an electron-beam exposure apparatus, and the like.

Note that, the disclosures of all publications, PCT international publications, U.S. Patent Application Publications, and U.S. patents related to the exposure apparatuses cited in this description so far are each incorporated herein by reference.

Electronic devices such as semiconductor devices are manufactured through the steps such as; a step for performing function/performance design of a device, a step for making a reticle based on this design step, a step for making a wafer from a silicon material, a lithography step for transferring a pattern of a mask (reticle) onto the wafer by the exposure apparatus (pattern formation apparatus) and the exposure method related to the embodiment previously described, a development step for developing the wafer which has been exposed, an etching step for removing by the etching an exposed member of an area other than the area where the resist remains, a resist removing step for removing the resist that is no longer necessary since etching has been completed, a device assembly step (including a dicing process, a bonding process, and a package process), and an inspection step. In this case, in the lithography step, because the device pattern is formed on the wafer using the exposure apparatus of the embodiment above and performing the exposure method previously described, a highly integrated device can be manufactured with good productivity.

INDUSTRIAL APPLICABILITY

As is described so far, the movable body apparatus of the present invention is suitable for suppressing deformation of a holding member holding an object and moving the object with good precision. Further, the exposure apparatus of the present invention is suitable for exposing an object. Further, the device manufacturing method of the present invention is suitable for manufacturing microdevices.

REFERENCE SIGNS LIST

10 . . . exposure apparatus, 12 . . . base board, 17 . . . coil, 18 . . . permanent magnet, 19 . . . second stage measurement system, 20 . . . main controller, 22 . . . slider, $23_1$ to $23_3$ . . . rod members, $24_1$ to $24_3$ . . . rod members, 25 . . . supporting member, 25c . . . edges, 26 . . . frame, 27 . . . rod-shaped section, 28 . . . X frame member, 29 . . . coupling member, 31 . . . tube, 42 . . . second stage member, 51A . . . wafer stage driving system (planar motor), 58 . . . coolant supply device, 59 . . . the first control system, 61 . . . second base, 70 . . . position measurement system, 73 . . . encoder system, $73X_1$ . . . X head (X encoder), 73Y . . . Y head (Y encoder), $74X_1$ . . . X scale, 74Y . . . Y scale, 78 . . . interferometer system, 85 . . . stage device, 100 . . . the first two degrees of freedom control system, 102 . . . the first planar motor FF controlling section, 103 . . . planar motor FB controlling section, 140 . . . vertical movement pin, 142 . . . driver, 150 . . . wafer center supporting member, 200 . . . the second two degrees of freedom control system, 202 . . . VCMFF controlling section, 203 . . . VCMFB controlling section, 500 . . . the second planar motor FF controlling section, IL . . . illumination light, IOP . . . illumination system, PL . . . projection optical system, Mb . . . voice coil motor, TC . . . tube carrier, W . . . wafer, WST . . . wafer stage, WTB . . . wafer table.

CITATION LIST

Patent Literature

[PTL 1] PCT International Publication No. 2011/040642
The invention claimed is:
1. A movable body apparatus, comprising:
a movable body that holds an object and is movable relative to a base; and
a drive device having a mover provided at the movable body and a stator provided at the base, wherein
the movable body has a slider section, a support member, a frame, a holding member, and a vibration-damping section, the mover being attached to the slider section, the holding member being supported by the support member, the support member being kinematically supported via a plurality of rod members attached to the slider section, the frame being connected to a position of the slider section which is different from a position where the rod members are attached, the vibration-damping section being provided between the frame and the support member, the holding member holding the object, and the vibration-damping section suppressing vibration of the support member.

2. The movable body apparatus according to claim 1, wherein
the movable body has a first opposing section and a second opposing section, the first opposing section being provided at the frame,
the second opposing section being provided at the support member, and the first opposing section and the second opposing section opposing each other with a predetermined gap in between, and
the vibration-damping section suppresses vibration of the support member using a force generated by a fluid functioning as a squeeze damper film in the gap between the first opposing section and the second opposing section.

3. The movable body apparatus according to claim 2, wherein
the force is generated by the first opposing section and the second opposing section being relatively moved and a size of the gap being changed.

4. The movable body apparatus according to claim 1, wherein
the force is a force generated by at least one of a flow and a compression of a fluid located in the gap.

5. The movable body apparatus according to claim 1, wherein
the plurality of rod members have rigidities in different directions, respectively.

6. The movable body apparatus according to claim 1, wherein
the plurality of rod members include a first rod member having rigidity in a first direction and a second rod member having rigidity in a second direction.

7. The movable body apparatus according to claim 2, wherein
the movable body is movable relative to the base, at least in directions of three degrees of freedom within a predetermined plane that includes a first axis and a second axis orthogonal to each other, and
the gap is formed by the first opposing section and the second opposing section being separated from each other in a direction of a third axis intersecting the predetermined plane.

8. The movable body apparatus according to claim 7, wherein
the first opposing section and the second opposing section are relatively movable at least in a direction along the third axis.

9. The movable body apparatus according to claim 8, wherein
the force suppresses the support member from vibrating in any one of a direction of the third axis, a direction around the first axis and a direction around the second axis.

10. The movable body apparatus according to claim 7, wherein
a plurality of the gaps are placed apart from each other in a direction along the first axis.

11. The movable body apparatus according to claim 6, wherein
the first direction is parallel to the first axis direction and the second direction is parallel to the second axis.

12. The movable body apparatus according to claim 1, wherein
the drive device provides a planar motor that drives the movable body relative to the base in directions of six degrees of freedom.

13. The movable body apparatus according to claim 12, wherein
the mover includes a magnet unit including a plurality of permanent magnets, and the stator includes a coil unit that is relatively movable with respect to the magnet unit and includes a plurality of coils placed along the predetermined plane.

14. The movable body apparatus according to claim 12, wherein
the planar motor generates a driving force acting in a direction along the first axis and a driving force acting in a direction along the second axis, and
the plurality of rod members include a rod member having rigidity in a first direction and a rod member having rigidity in a second direction.

15. An exposure apparatus, comprising:
the movable body apparatus according to claim 1; and
a pattern generating device that generates a pattern on the object by irradiating the object with an energy beam.

16. The exposure apparatus according to claim 15, further comprising:
a coolant supply device that is connected to a flow passage provided at the slider section of the movable body apparatus, and supplies a coolant to the flow passage.

17. A device manufacturing method, including:
exposing an object using the exposure apparatus according to claim 15; and
developing the object that has been exposed.

18. An exposure apparatus by a step-and-scan method, comprising:
the movable body apparatus according to claim 1; and
a pattern generating device that generates a pattern on the object by irradiating the object with an energy beam, wherein
the plurality of rod members of the movable body apparatus include a rod member having rigidity in a scanning direction and a rod member having rigidity in a cross-scanning direction that intersects the scanning direction.

19. The exposure apparatus according to claim 18, further comprising:
a coolant supply device that is connected to a flow passage provided at the slider section of the movable body apparatus, and supplies a coolant to the flow passage.

20. A device manufacturing method, including:
exposing an object using the exposure apparatus according to claim 18; and
developing the object that has been exposed.

* * * * *

UNITED STATES PATENT AND TRADEMARK OFFICE
CERTIFICATE OF CORRECTION

PATENT NO. : 10,048,598 B2
APPLICATION NO. : 14/901543
DATED : August 14, 2018
INVENTOR(S) : Yuichi Shibazaki It is certified that error appears in the above-identified patent and that said Letters Patent is hereby corrected as shown below:

On the Title Page

Please correct item (72) to read as follows:
(72)    Inventor:    Yuichi Shibazaki, Kumagaya-shi (JP)

Signed and Sealed this
Second Day of April, 2019

Andrei Iancu
*Director of the United States Patent and Trademark Office*